(12) United States Patent
Wang

(10) Patent No.: US 12,122,888 B2
(45) Date of Patent: Oct. 22, 2024

(54) THIN FILM MATERIAL AND MANUFACTURING METHOD OF THIN FILM MATERIAL

(71) Applicant: WUHAN CHINA STAR OPTOELECTRONICS SEMICONDUCTOR DISPLAY TECHNOLOGY CO., LTD., Hubei (CN)

(72) Inventor: Yamin Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 1099 days.

(21) Appl. No.: 16/971,372

(22) PCT Filed: Jan. 7, 2020

(86) PCT No.: PCT/CN2020/070603
§ 371 (c)(1),
(2) Date: Aug. 20, 2020

(87) PCT Pub. No.: WO2021/120348
PCT Pub. Date: Jun. 24, 2021

(65) Prior Publication Data
US 2021/0189077 A1    Jun. 24, 2021

(30) Foreign Application Priority Data
Dec. 18, 2019  (CN) .......................... 201911310621.9

(51) Int. Cl.
B05D 1/00     (2006.01)
B05D 3/02     (2006.01)
(Continued)

(52) U.S. Cl.
CPC .............. *C08J 5/18* (2013.01); *B05D 3/0209* (2013.01); *C08G 73/1003* (2013.01);
(Continued)

(58) Field of Classification Search
None
See application file for complete search history.

(56) References Cited

U.S. PATENT DOCUMENTS 3,245,965 A * 4/1966 Tuemmler .............. C09B 47/04
540/123
4,499,260 A * 2/1985 Achar .................... C08G 73/20
528/229
2014/0148596 A1    5/2014 Dichtel et al.

FOREIGN PATENT DOCUMENTS

CN        1320651 A      11/2001
CN     101787130 B        4/2012
(Continued)

OTHER PUBLICATIONS

International Search Report (Year: 2022).*
(Continued)

*Primary Examiner* — David P Turocy
(74) *Attorney, Agent, or Firm* — PV IP PC; Wei Te Chung

(57) ABSTRACT

The present disclosure provides a thin film material and a manufacturing method thereof. The manufacturing method of the thin film material comprises: a compound A and a first reactant reacting to form a compound B; the compound B and a second reactant reacting to form a compound C; the compound C and a third reactant reacting to form a polymer D; the polymer D reacting to obtain a mixture including a polymer F or a polymer H; and a solution including the polymer F or the polymer H forming the polymer F or the polymer H on a substrate.

15 Claims, 8 Drawing Sheets

(51) Int. Cl.
  *C08G 73/10* (2006.01)
  *C08J 5/18* (2006.01)
  *H10K 71/00* (2023.01)
  *H10K 77/10* (2023.01)

(52) U.S. Cl.
  CPC ..... *C08G 73/1028* (2013.01); *C08G 73/1039* (2013.01); *C08G 73/1085* (2013.01); *H10K 71/00* (2023.02); *H10K 77/111* (2023.02); *C08G 2150/00* (2013.01)

(56) References Cited

FOREIGN PATENT DOCUMENTS

| CN | 105017504 A | 11/2015 |
| CN | 105778090 A | 7/2016 |
| CN | 107857880 A | 3/2018 |
| CN | 109232892 A | 1/2019 |

OTHER PUBLICATIONS

«journal of Materials Chemistry C» Chen, Linlin, Etc. Synthesis and properties of a high dielectric constant copolymer of a copperphthalocyanine oligomer grafted to amino-capped polyimide.

\* cited by examiner

THIN FILM MATERIAL AND MANUFACTURING METHOD OF THIN FILM MATERIAL

FIELD OF INVENTION

The present disclosure relates to the field of display technologies, and more particularly, to a thin film material and a manufacturing method thereof.

BACKGROUND OF INVENTION

Organic light-emitting diodes (OLEDs) have characteristics of self-illumination, high brightness, wide viewing angles, high contrast, flexibility, and low energy consumption, so OLED display panels, especially flexible OLED display panels, have received widespread attention.

Heat resistance, mechanical properties, and optical properties of current polymer thin film materials used as a substrate material for flexible OLED display panels are difficult to meet the needs at a same time for being a substrate material.

Therefore, a new thin film material and a manufacturing method of the thin film material are needed to solve the above technical problem.

Technical problem: the present disclosure provides a thin film material and a manufacturing method thereof to solve the problem that heat resistance, mechanical properties, and optical properties of current polymer thin film materials are difficult to meet the needs at a same time for being a flexible substrate material used in display panels.

SUMMARY OF INVENTION

The present disclosure provides a manufacturing method of a thin film material. The method comprises:
S1: in a first container, a compound A and a first reactant reacting to form a compound B;
S2: in a second container, the compound B and a second reactant reacting to form a compound C;
S3: in a third container, the compound C and a third reactant reacting to form a polymer D;
S4: in a fourth container, the polymer D reacting to obtain a second mixture including a polymer F or a polymer H; and
S5: a solution including the polymer F or a solution including the polymer H forming the polymer F or the polymer H on a substrate;
wherein a structural formula of the polymer F is:

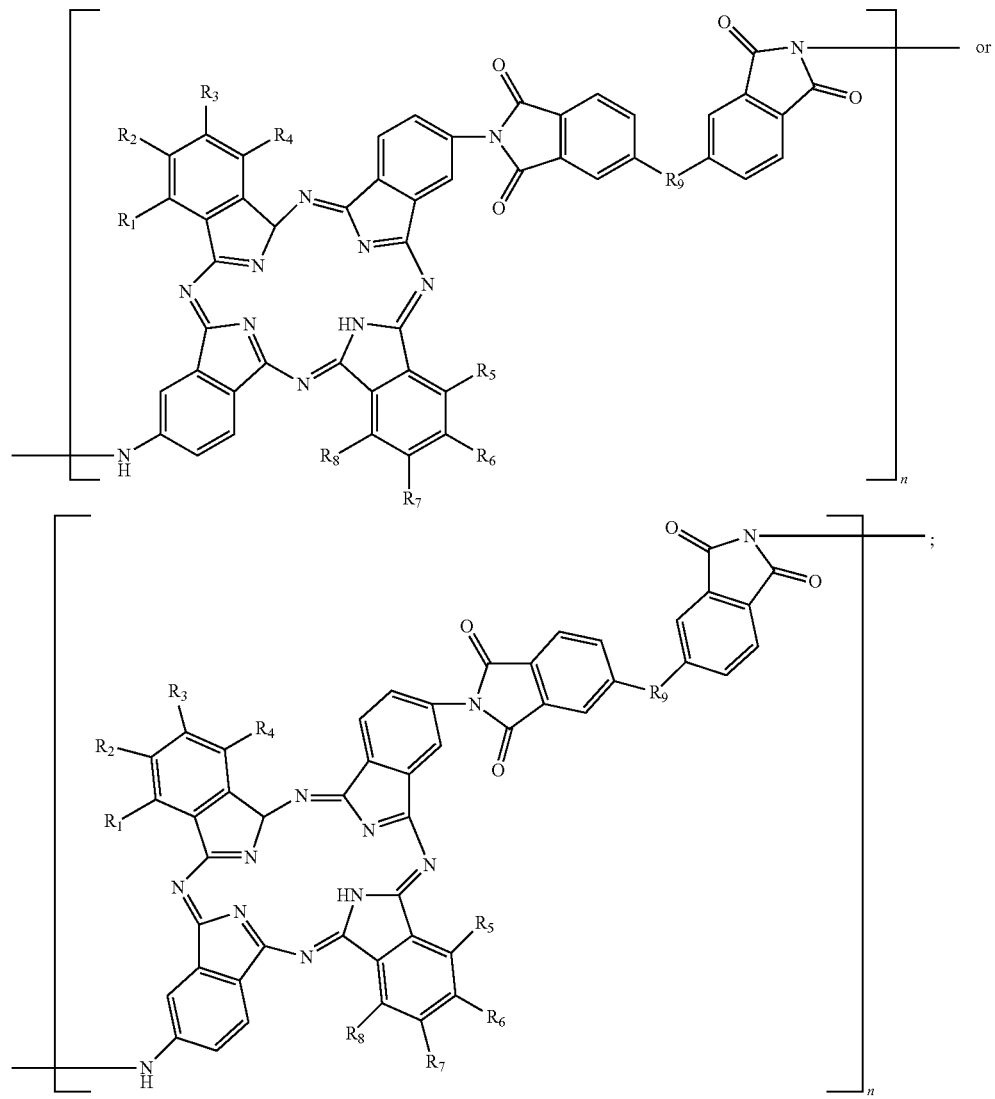

a structural formula of the polymer H is:
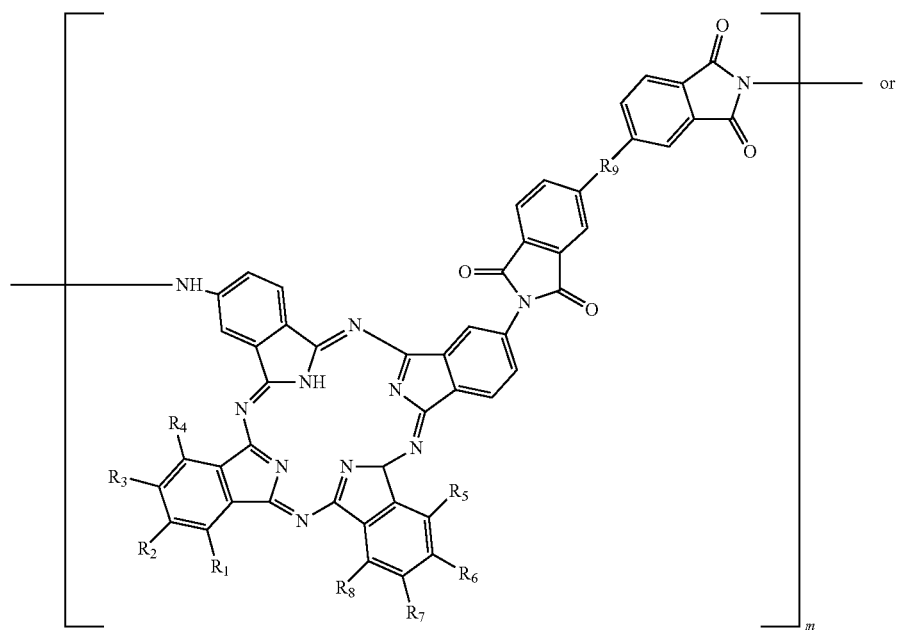
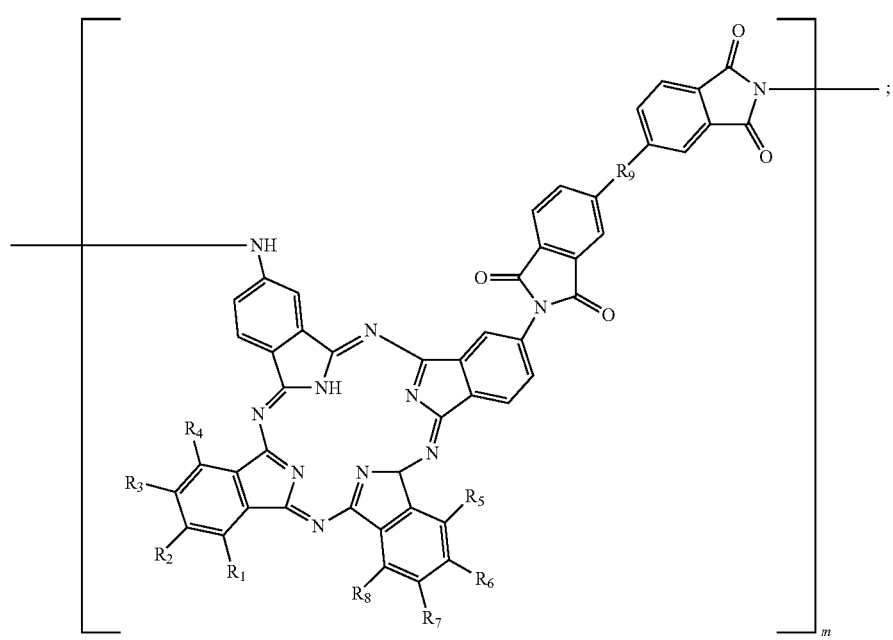
wherein $R_1$, $R_2$, $R_3$, $R_4$, $R_5$, $R_6$, $R_7$, and $R_8$ are independently a hydrogen atom or an aliphatic alkyl group, and $R_9$ is a fluorine-containing group.
In the manufacturing method of the thin film material provided in the present disclosure, a structural formula of the compound A is:

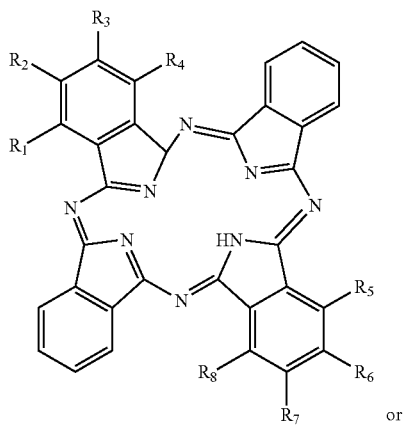

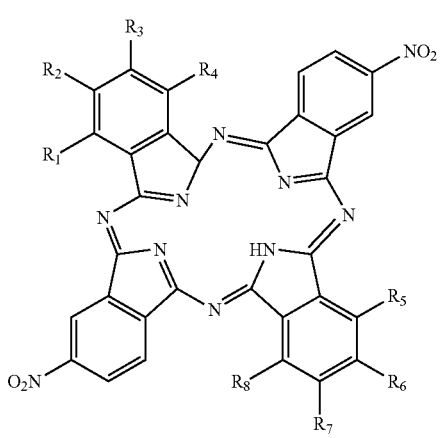

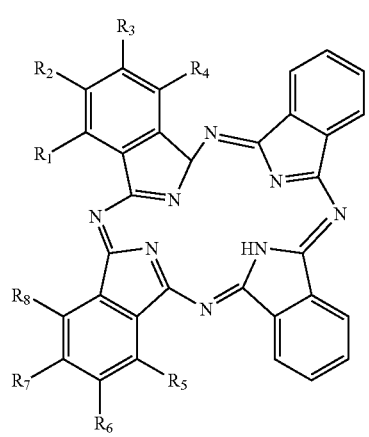

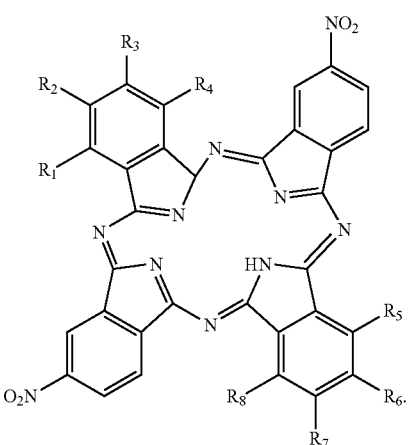

wherein $R_1$, $R_2$, $R_3$, $R_4$, $R_5$, $R_6$, $R_7$, and $R_8$ are independently a hydrogen atom or an aliphatic alkyl group.

In the manufacturing method of the thin film material provided in the present disclosure, wherein the step S1 comprises:

S11: providing a first container containing a first solvent dissolving with the compound A; and S12: adding the first reactant to the first container drop by drop and forming a compound B1 at a first reaction temperature for a first reaction time or adding the first reactant to the first container at one time and forming a compound B2 at a first reaction temperature for a first reaction time.

In the manufacturing method of the thin film material provided in the present disclosure, wherein a structural formula of the compound B1 is:

In the manufacturing method of the thin film material provided in the present disclosure, wherein a structural formula of the compound B2 is:

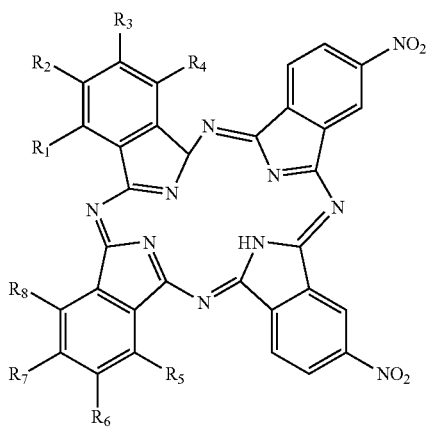

-continued

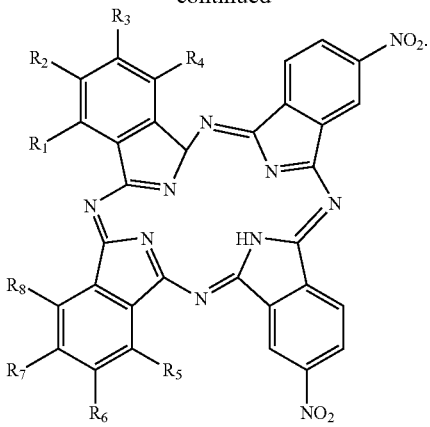

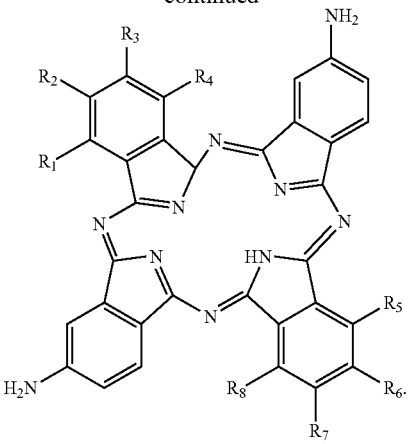

In the manufacturing method of the thin film material provided in the present disclosure, wherein the first reactant comprises sodium nitrite.

In the manufacturing method of the thin film material provided in the present disclosure, wherein the step S1 further comprises:
- S13: adding a first volume of a first separating agent in the first container, then stirring, and setting aside;
- S14: adding a second volume of a second separating agent in the first container, then extracting, collecting an organic layer, and rotarily evaporating to obtain a first crude product including the compound B1 or the compound B2; and
- S15: leaching the first crude product by a first eluent and rotarily evaporating to obtain the purified compound B1 or the purified compound B2.

In the manufacturing method of the thin film material provided in the present disclosure, wherein the step S2 comprises:
- S21: providing a second container containing a second solvent dissolving with the compound B;
- S22: adding the second reactant to the second container slowly at a second reaction temperature; and
- S23: terminating a reaction in the second container after reacting at a third reaction temperature for a second reaction time to obtain a first mixture including a compound C1 or a compound C2.

In the manufacturing method of the thin film material provided in the present disclosure, wherein a structural formula of the compound C1 is:

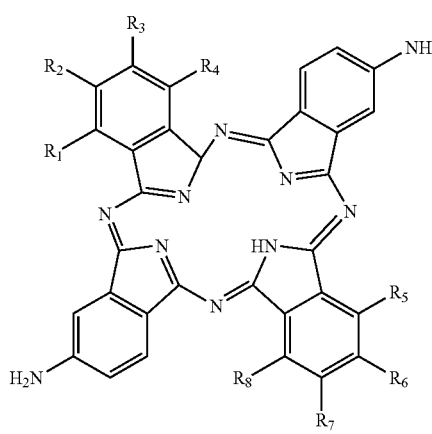

or

In the manufacturing method of the thin film material provided in the present disclosure, wherein a structural formula of the compound C2 is:

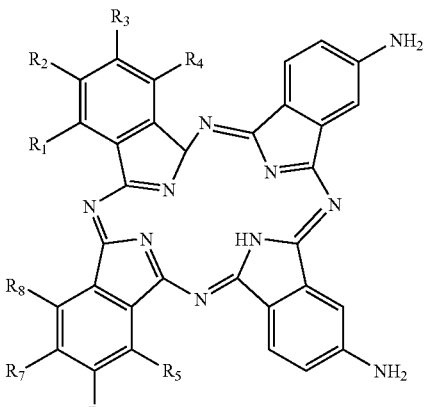

or

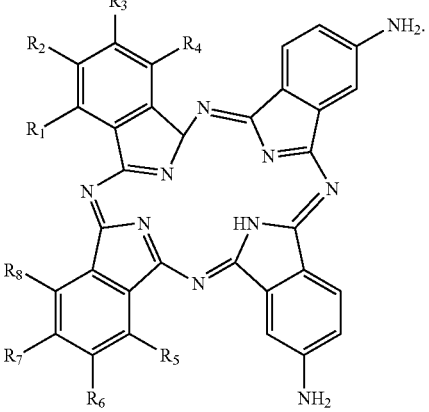

In the manufacturing method of the thin film material provided in the present disclosure, wherein the second reactant comprises hydrazine dihydrochloride.

In the manufacturing method of the thin film material provided in the present disclosure, wherein the step S2 further comprises:
- S24: rotarily evaporating the first mixture to obtain a second crude product, and rotarily evaporating a filtrate obtained by leaching the second crude product by a second eluent to obtain the purified compound C1 or the purified compound C2.

In the manufacturing method of the thin film material provided in the present disclosure, wherein the step S3 comprises:

S31: providing a third container containing a third solvent dissolving with the compound C; and S32: adding the third reactant to the third container at a fourth reaction temperature for a third reaction time to form a polymer D1 or a polymer D2.

In the manufacturing method of the thin film material provided in the present disclosure, wherein a structural formula of the polymer D1 is:

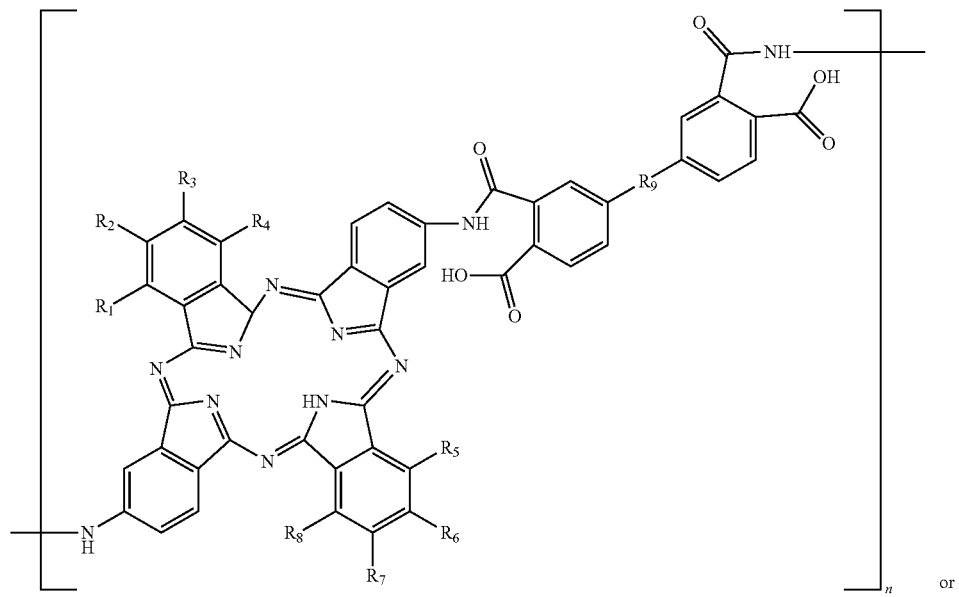

or

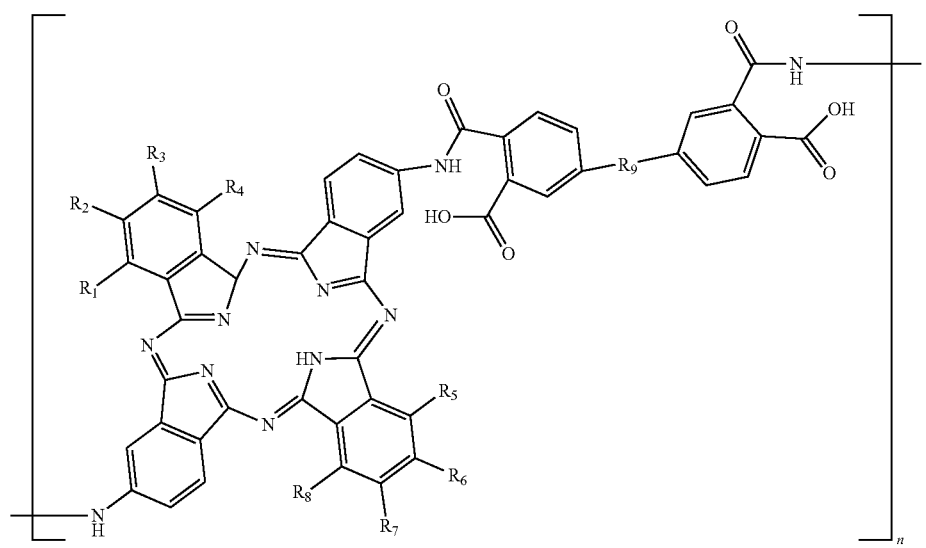

.

In the manufacturing method of the thin film material provided in the present disclosure, wherein a structural formula of the polymer D2 is:
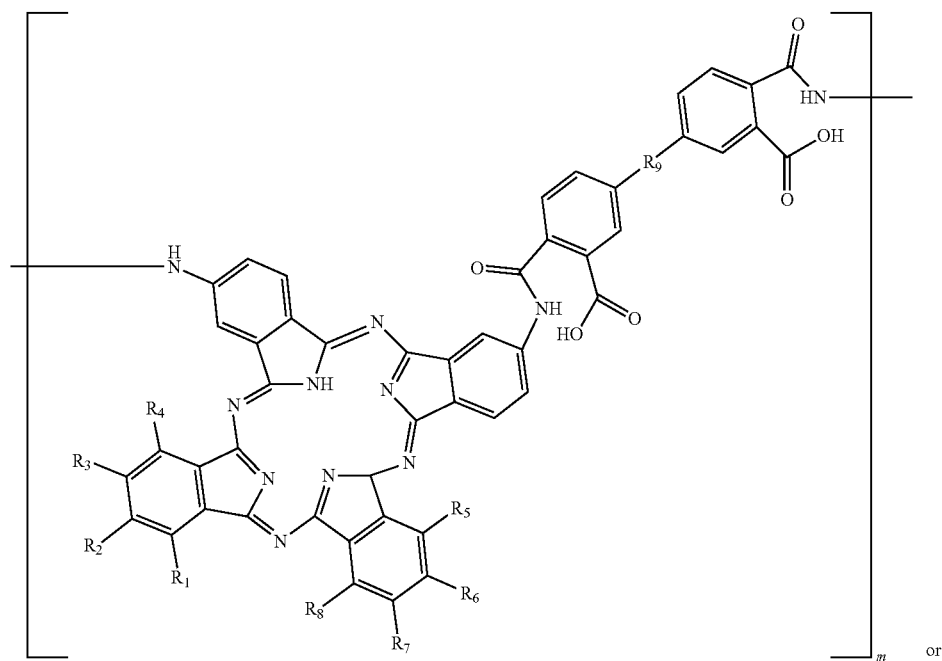
or
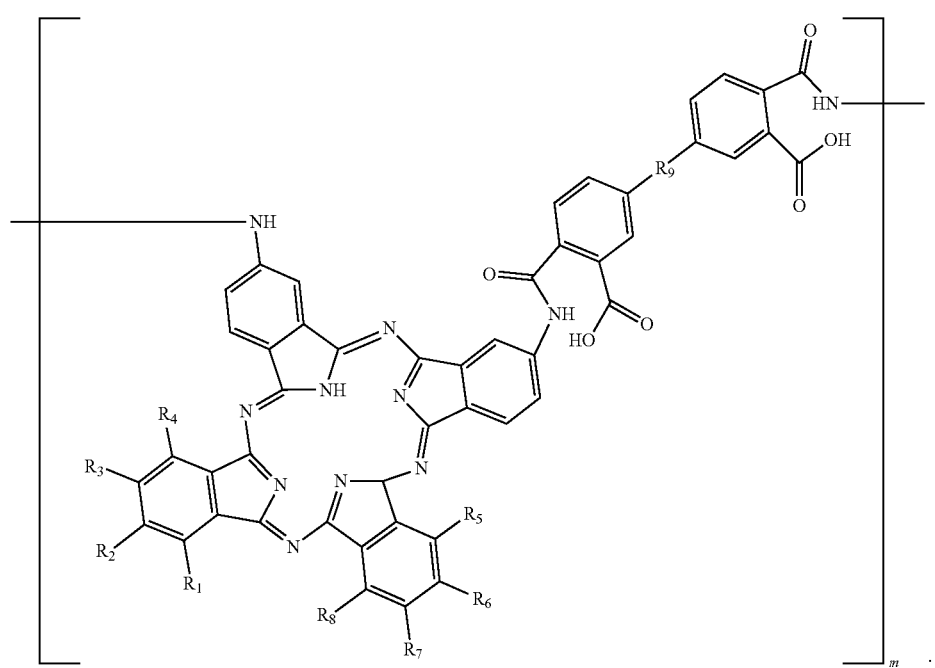

In the manufacturing method of the thin film material provided in the present disclosure, wherein the third reactant is a fluorine-containing dianhydride compound.

In the manufacturing method of the thin film material provided in the present disclosure, wherein the step S4 comprises:
- S41: providing a fourth container containing a fourth solvent dissolving with the polymer D;
- S42: terminating a reaction in the fourth container after reacting at a fifth reaction temperature for a fourth reaction time to obtain the second mixture including the polymer F or the polymer H; and
- S43: filtering the second mixture using an organic filtration membrane at a first filter temperature to obtain the solution including the polymer F or the solution including the polymer H.

In the manufacturing method of the thin film material provided in the present disclosure, wherein the step S5 comprises:
- S51: coating the solution including the polymer F or the solution including the polymer H on the substrate;
- S52: forming the polymer F or the polymer H on the substrate by a first predetermined process; and
- S53: the polymer F or the polymer H forming the thin film material by a second predetermined process.

In the manufacturing method of the thin film material provided in the present disclosure, wherein the step S52 comprises:
- S52a: transferring the substrate to a first oven to remove a fourth solvent at a first drying temperature for a first drying time; and
- S52b: transferring the substrate to a second oven to form the polymer F or the polymer H on the substrate at a second drying temperature for a second drying time.

The present disclosure further provides a thin film material which comprises a polymer F or a polymer H;
wherein a structural formula of the polymer F is:

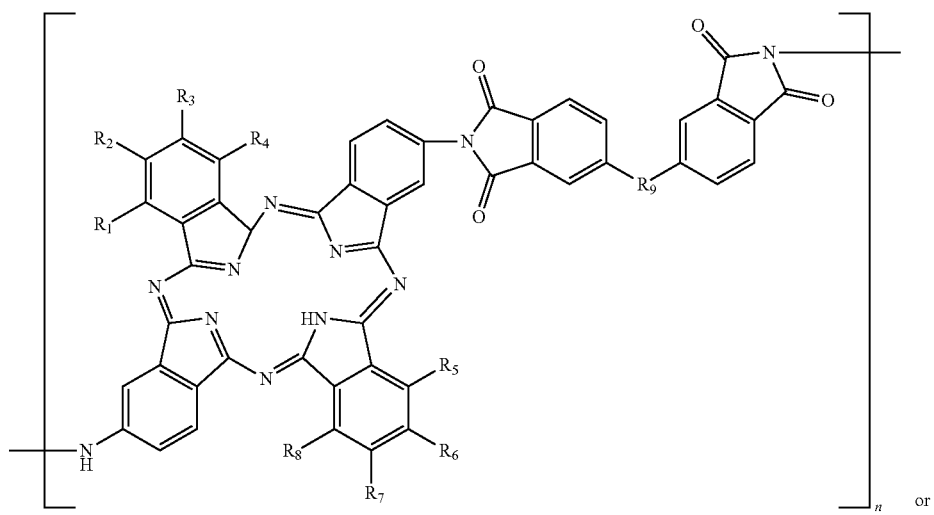

or

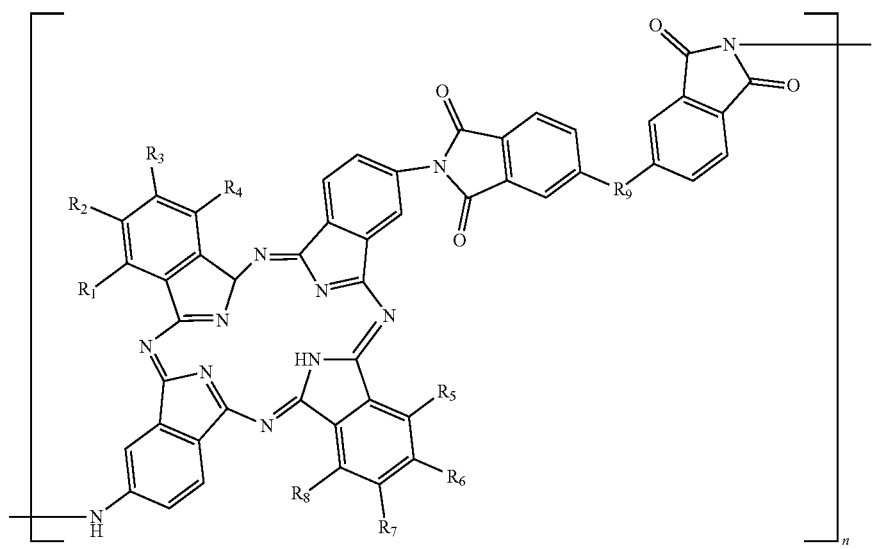

;

a structural formula of the polymer H is:

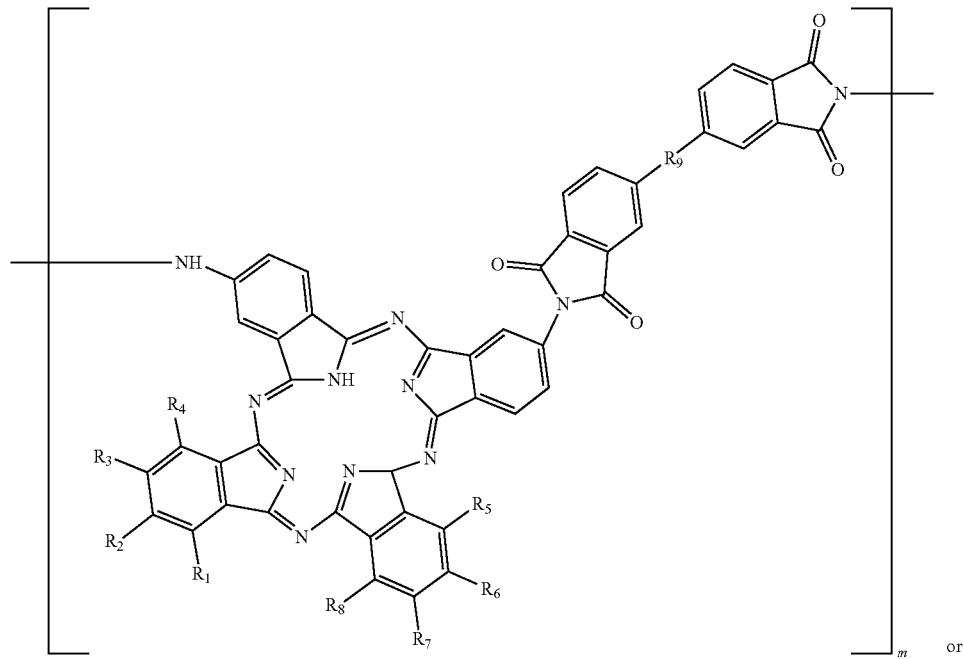

or

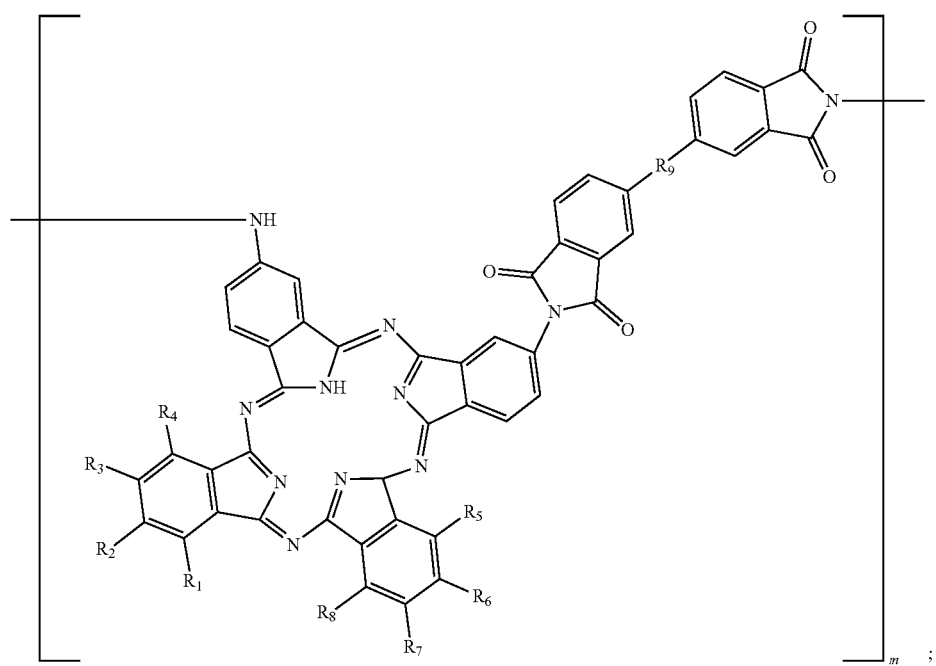

;

wherein R1, R2, R3, R4, R5, R6, R7, and R8 are independently a hydrogen atom or an aliphatic alkyl group, and R9 is a fluorine-containing group.

Beneficial effect: the present disclosure manufactures a polyimide thin film material having pyridine rings as a main chain structure by a new manufacturing method of a thin film material, thereby effectively improving heat resistance, mechanical properties, and optical properties of the polyimide thin film material.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

The present disclosure provides a thin film material and a manufacturing method thereof. In order to make the purpose, technical solutions, and effects of the present disclosure clearer and more definite, the following further describes the present disclosure in detail with reference to the drawings and embodiments. It should be understood that the specific embodiments described herein are only used to explain the disclosure, and are not used to limit the disclosure.

Current thin film materials have a problem that their heat resistance, mechanical properties, and optical properties are difficult to meet the needs at a same time for being a flexible substrate material used in display panels. Therefore, the present disclosure provides the thin film material and the manufacturing method thereof.

Figure 1:
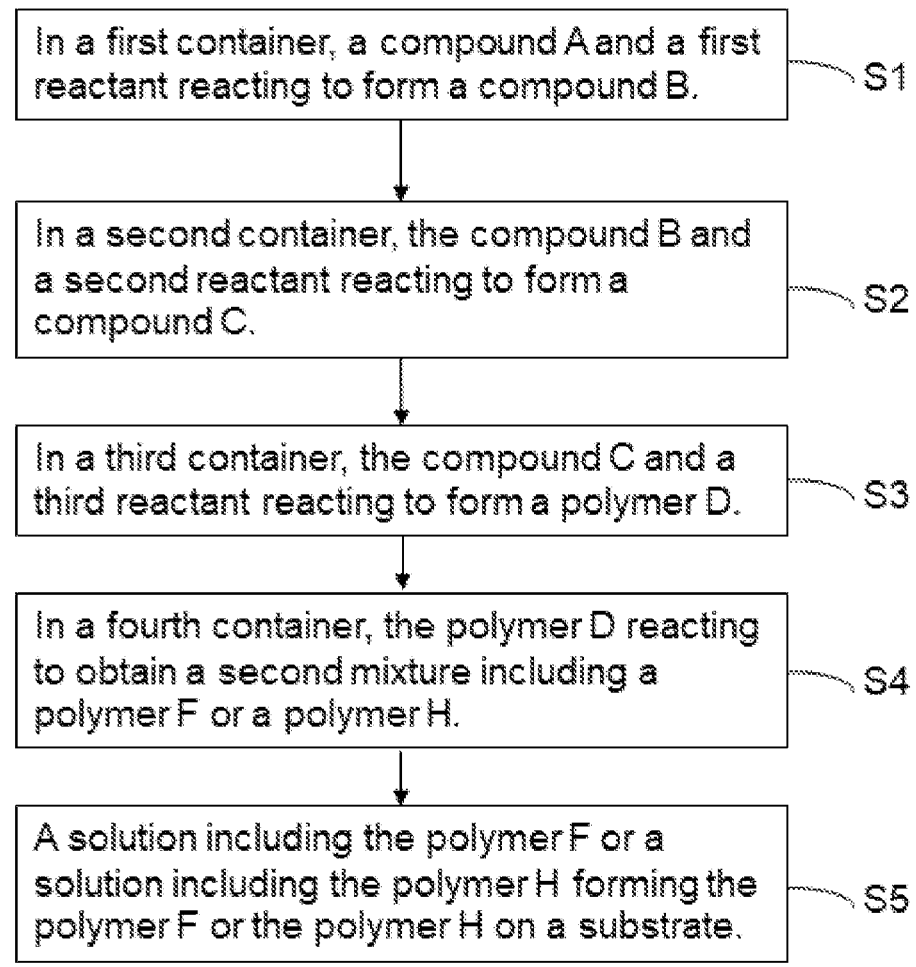
FIG. 1 is a flowchart of a manufacturing method of a thin film material according to an embodiment of the present disclosure.

Referring to FIG. 1, the manufacturing method of the thin film material comprises:

S1: in a first container, a compound A and a first reactant reacting to form a compound B;

S2: in a second container, the compound B and a second reactant reacting to form a compound C;

S3: in a third container, the compound C and a third reactant reacting to form a polymer D;

S4: in a fourth container, the polymer D reacting to obtain a second mixture including a polymer F or a polymer H; and S5: a solution including the polymer F or a solution including the polymer H forming the polymer F or the polymer H on a substrate.

Wherein, a structural formula of the compound A is:

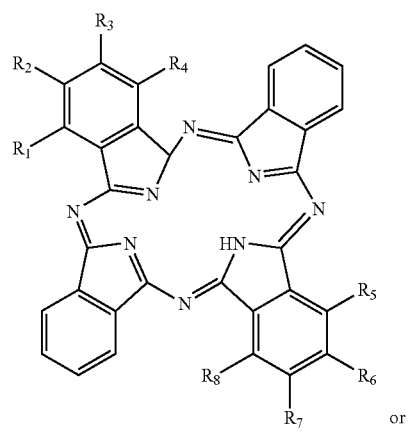

or

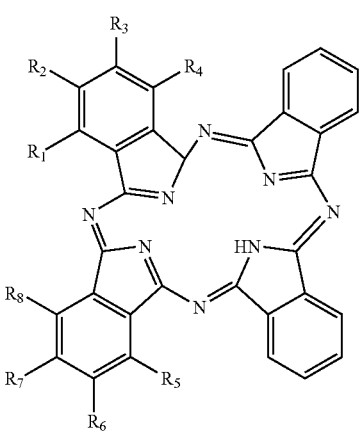

A structural formula of the polymer F is:
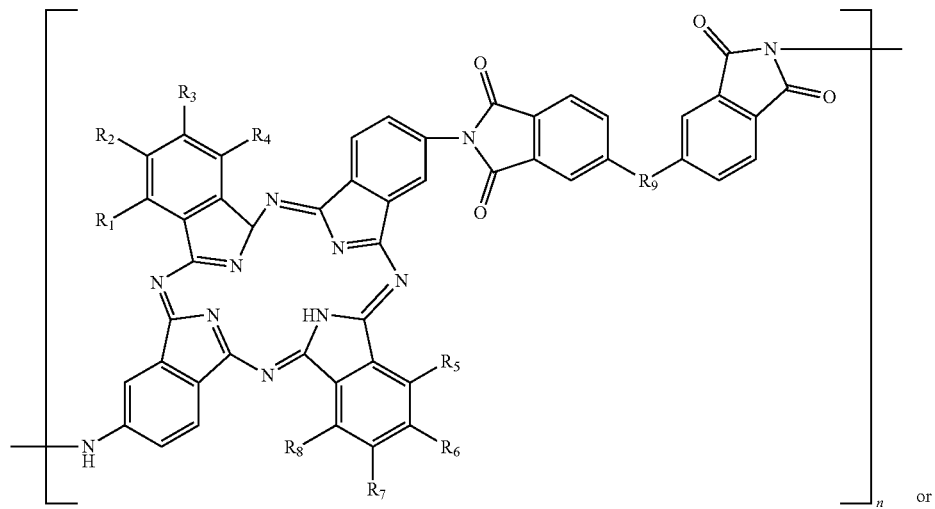
or
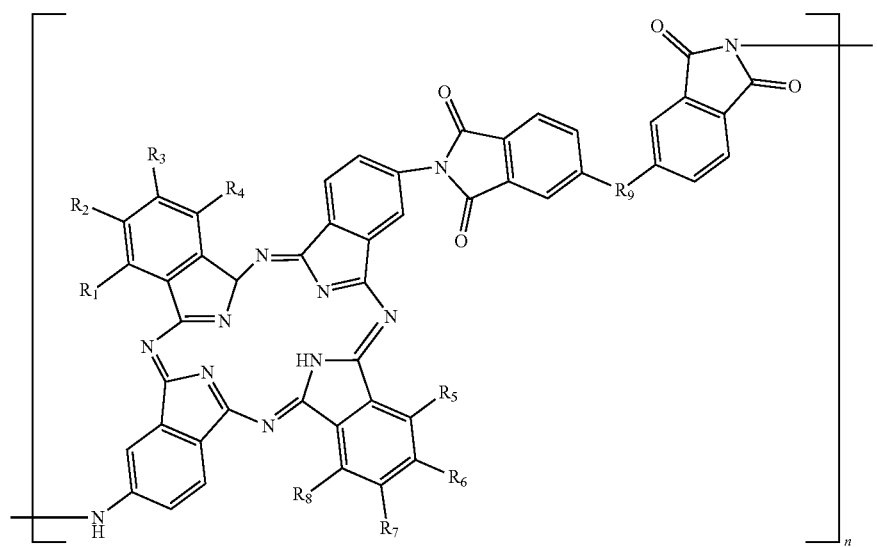

A structural formula of the polymer H is:
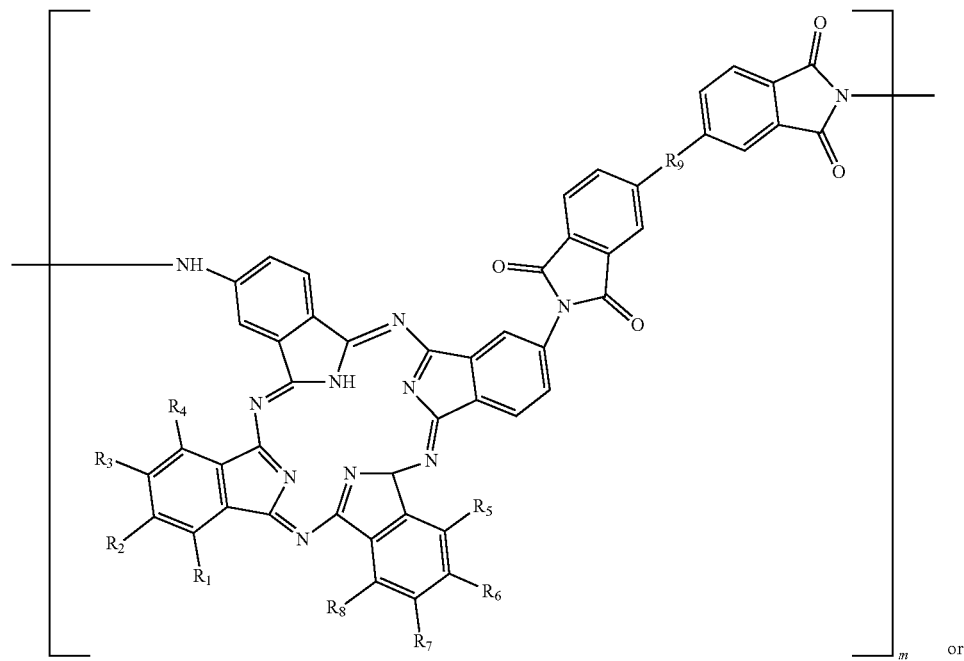
or
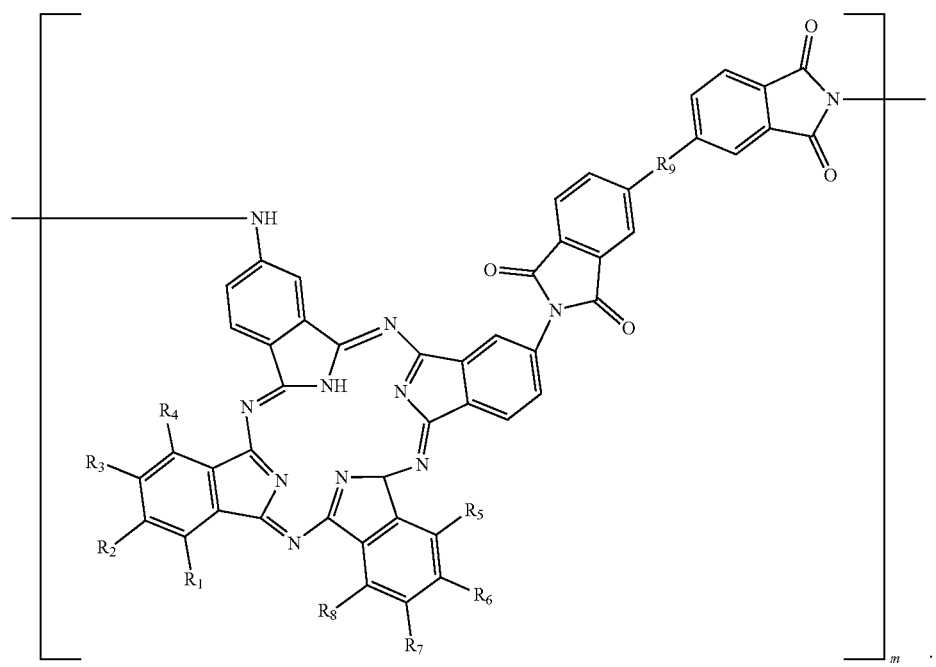

Wherein, $R_1$, $R_2$, $R_3$, $R_4$, $R_5$, $R_6$, $R_7$, and $R_8$ are independently a hydrogen atom or an aliphatic alkyl group, and $R_9$ is a fluorine-containing group.

In the embodiment, the structural formula of the compound A may be one of:

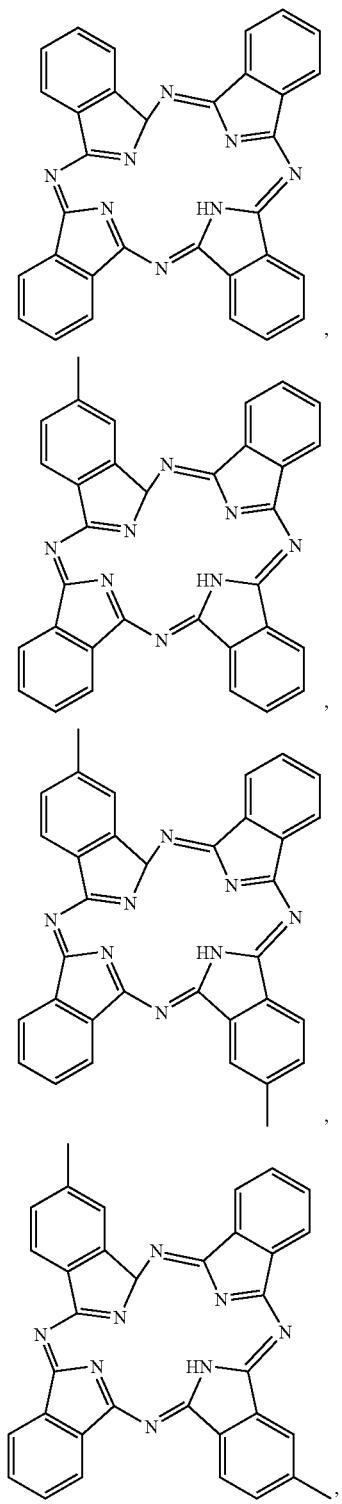

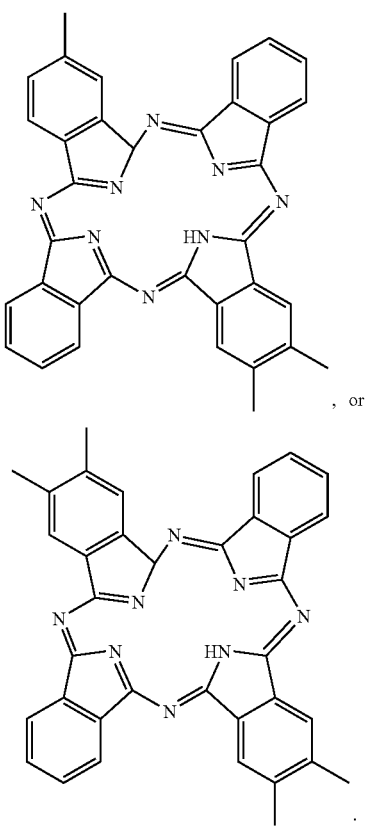

In the embodiment, $R_9$ may be one of

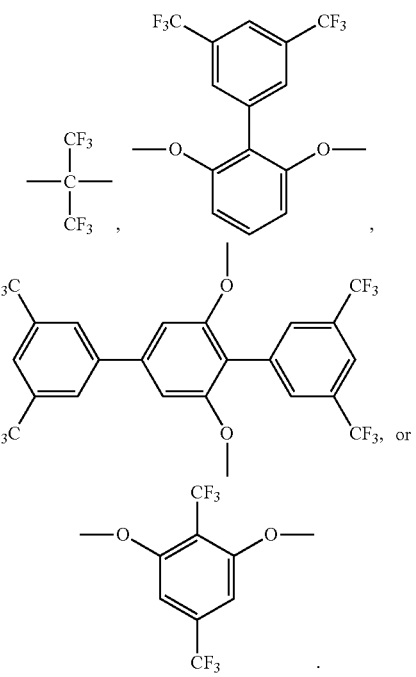

The present disclosure manufactures a polyimide thin film material having pyridine rings as a main chain structure by a new manufacturing method of a thin film material, thereby effectively improving heat resistance, mechanical properties, and optical properties of the polyimide thin film material.

Figure 2:
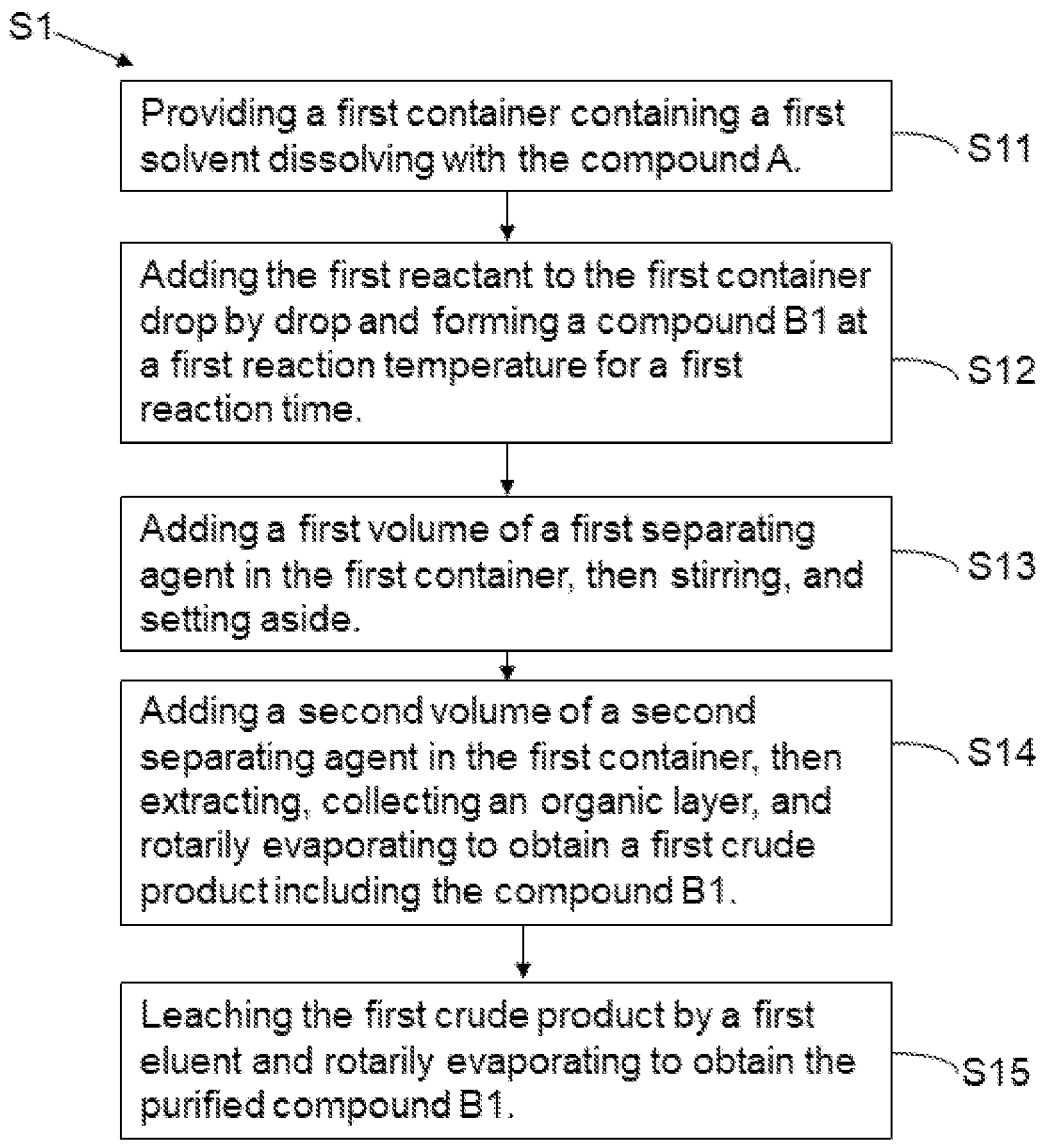
FIG. 2 is a flowchart of a first step S1 of a manufacturing method of a thin film material according to an embodiment of the present disclosure.
Figure 3:
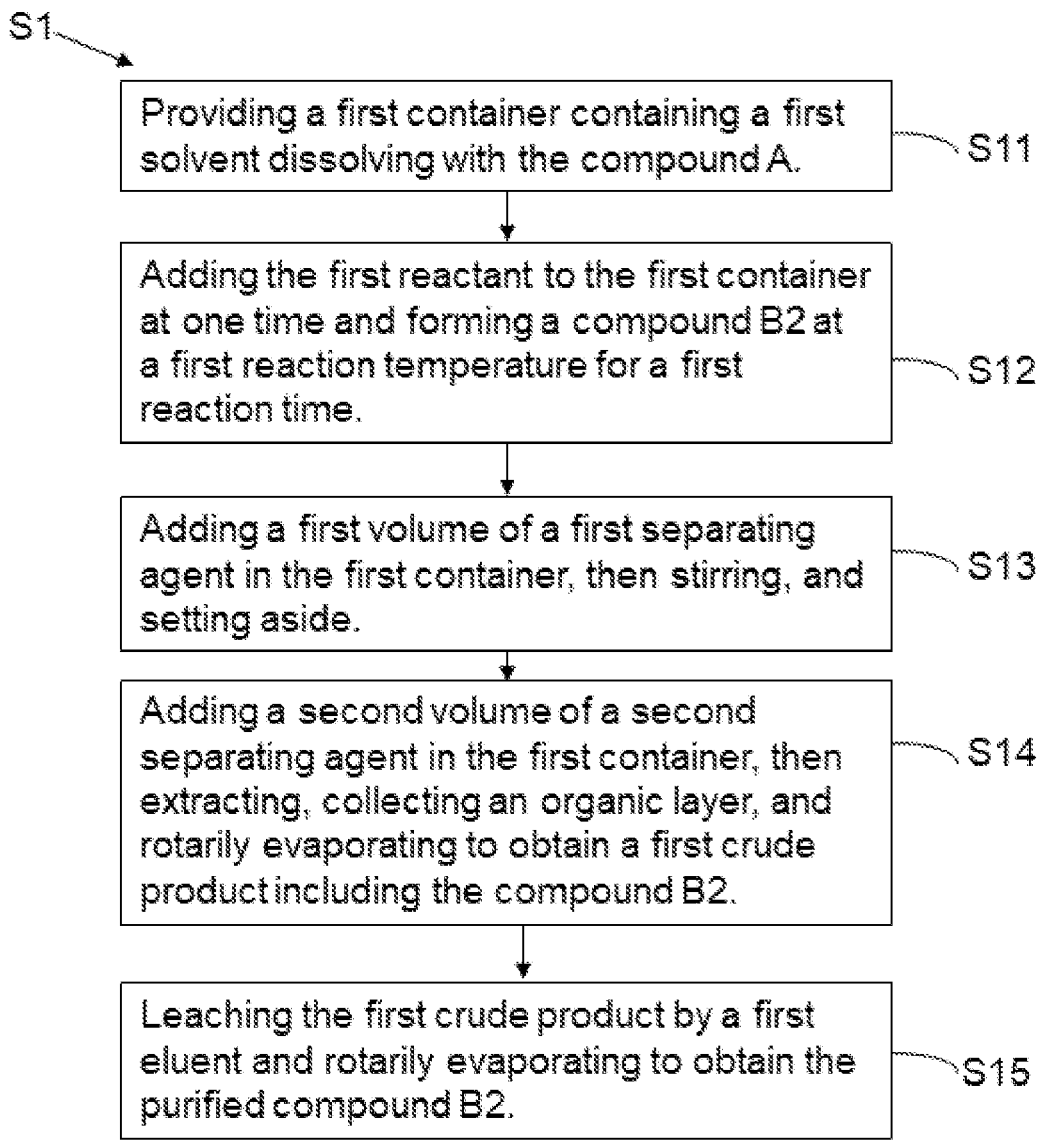
FIG. 3 is a flowchart of a second step S1 of a manufacturing method of a thin film material according to an embodiment of the present disclosure.

Referring to FIG. 2 and FIG. 3, the step S1 comprises:

S11: providing a first container containing a first solvent dissolving with the compound A.

In the embodiment, the first solvent can be trifluoroacetic acid.

S12: adding the first reactant to the first container drop by drop and forming a compound B1 at a first reaction temperature for a first reaction time or adding the first reactant to the first container at one time and forming a compound B2 at a first reaction temperature for a first reaction time.

In the embodiment, a structural formula of the compound B1 may be

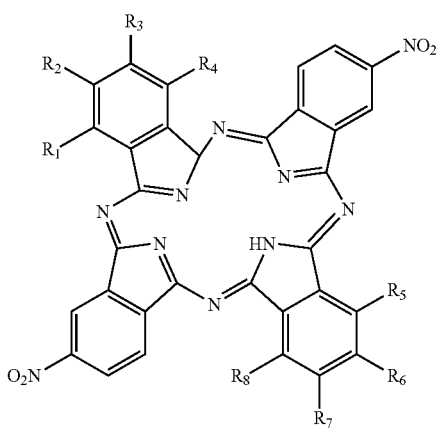

or

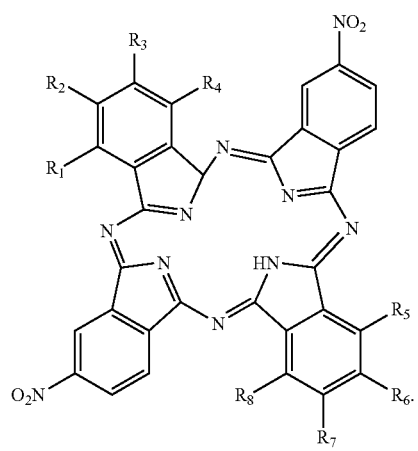

In the embodiment, a structural formula of the compound B2 is

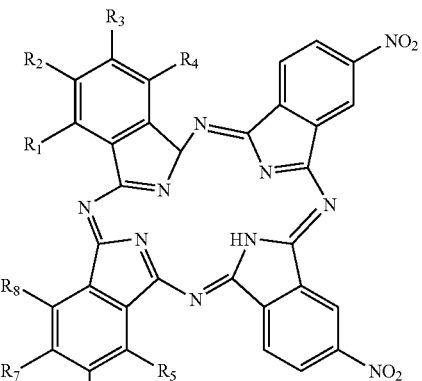

or

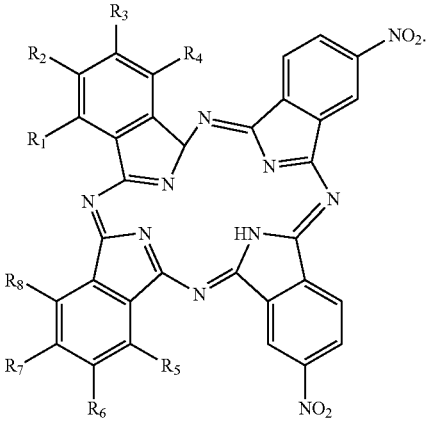

In the embodiment, the first reactant comprises sodium nitrite.

In the embodiment, the first reactant can be prepared by dissolving sodium nitrite in trifluoroacetic acid or in double distilled water.

In the embodiment, the first reaction temperature may range from 15° C. to 30° C., and preferably is 25° C.

When the reaction temperature is less than 15° C., a reaction rate would be too low that causes a too long reaction time. When the reaction temperature is too high, it would cause reaction by-products to increase that causes the yield of the compound B1 or the compound B2 to decrease. When the reaction temperature is 25° C., it would not produce excessive by-products, which causes the yield of the compound B1 or the compound B2 to decrease, and the reaction time would not be too long.

In the embodiment, the first reaction time can range from 5 to 35 minutes, and preferably 12 to 30 minutes.

In the embodiment, when the first reaction time is less than 5 minutes, the reaction time would be too short and cause the yield of the compound B1 or the compound B2 being too low. When the first reaction time is greater than 35 minutes, the reaction time would be too long and cause the reaction by-products to increase, which decreases the yield of the compound B1 or the compound B2. When the first reaction time ranges from 12 to 30 minutes, the yield of the compound B1 or the compound B2 is the maximum.

Referring to FIG. 2 and FIG. 3, the step S1 further comprises:

S13: adding a first volume of a first separating agent in the first container, then stirring, and setting aside.

In the embodiment, the first separating agent can be deionized water. The first volume can range from 80 ml to 120 ml, and is preferably 100 ml. When the volume of the first separating agent is less than 80 ml, the compound B cannot completely be separated from a mixed solution containing the first solvent and the first separating agent, which causes a loss of the compound B. When the volume of the first separating agent is greater than 120 ml, the dosage of the first separating agent is excessive, which causes a waste of the first separating agent. When the volume of the first separating agent is 100 ml, the compound B can completely be separated from the mixed solution containing the first solvent and the first separating agent, and it can prevent overuse of the first separating agent.

S14: adding a second volume of a second separating agent in the first container, then extracting, collecting an organic layer, and rotarily evaporating to obtain a first crude product including the compound B1 or the compound B2.

In the embodiment, the second separating agent can be an organic solvent that could dissolve the compound B and is not miscible with the first solvent and the first separating agent, such as dichloromethane.

S15: leaching the first crude product by a first eluent and rotarily evaporating to obtain the purified compound B1 or the purified compound B2.

In the embodiment, the first eluent can be a mixed solution of dichloromethane and petroleum ether, and a volume ratio of dichloromethane and petroleum ether is preferably 5:3.

Figure 4:
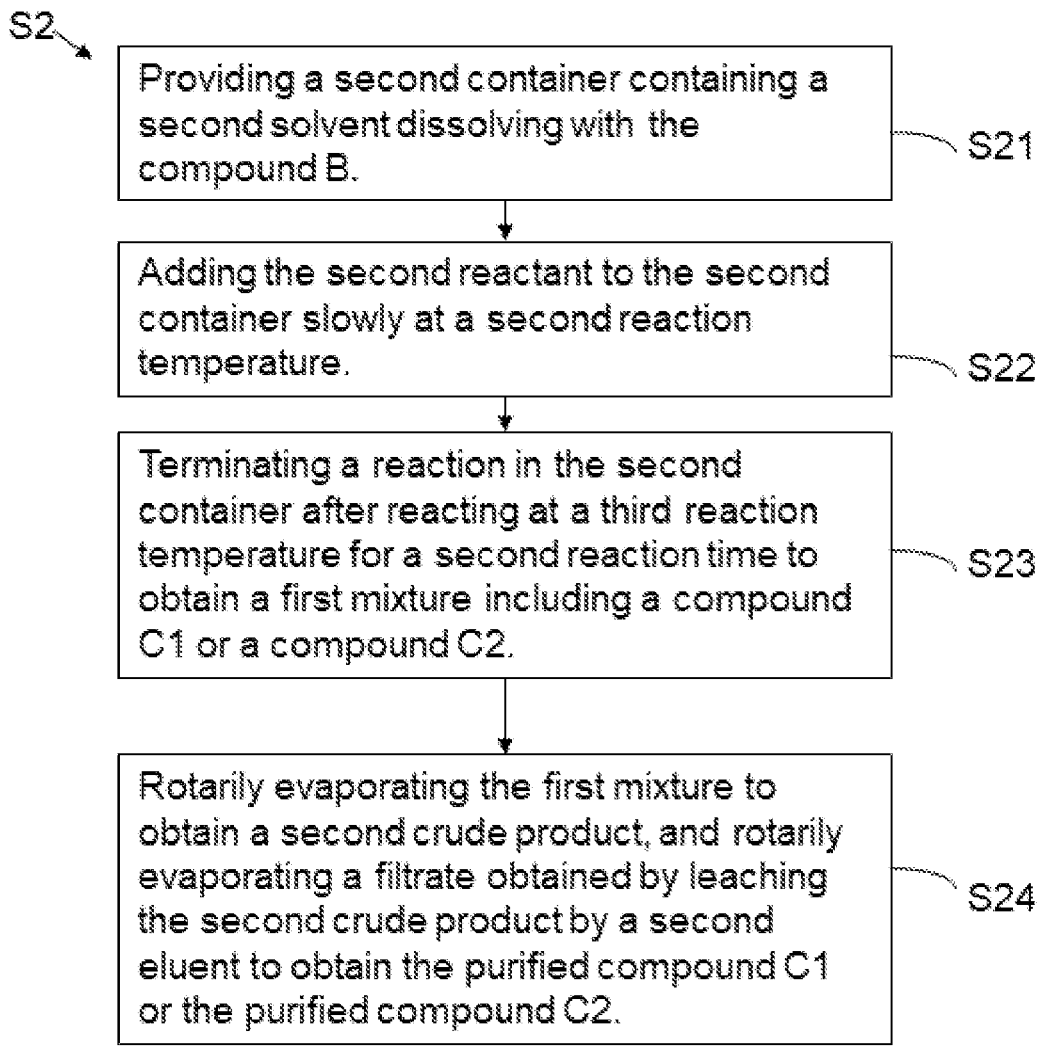
FIG. 4 is a flowchart of a step S2 of a manufacturing method of a thin film material according to an embodiment of the present disclosure.

Referring to FIG. 4, the step S2 comprises:

S21: providing a second container containing a second solvent dissolving with the compound B.

In the embodiment, the second solvent can be trifluoroacetic acid.

S22: adding the second reactant to the second container slowly at a second reaction temperature.

In the embodiment, the second reactant comprises hydrazine dihydrochloride.

In the embodiment, the second reaction temperature may range from 30° C. to 70° C., and preferably range from 40° C. to 60° C.

When the second reaction temperature is less than 30° C., solubility of the compound B in the second solvent is too small, which causes the compound B reacts incompletely with the second reactant and the yield of the produced compound C is too low. When the second reaction temperature is greater than 70° C., the second reaction temperature is too high, which causes by-products produced by reacting the second reactant and the compound B to increase and then the yield of the compound C to decrease. When the second reaction temperature ranges from 40° C. to 60° C., the second solvent can completely dissolve the compound B, and it would not cause the reaction by-products to increase due to the second reaction temperature being too high and not cause the yield of the compound C to decrease.

S23: terminating a reaction in the second container after reacting at a third reaction temperature for a second reaction time to obtain a first mixture including a compound C1 or a compound C2.

In the embodiment, a structural formula of the compound C1 is

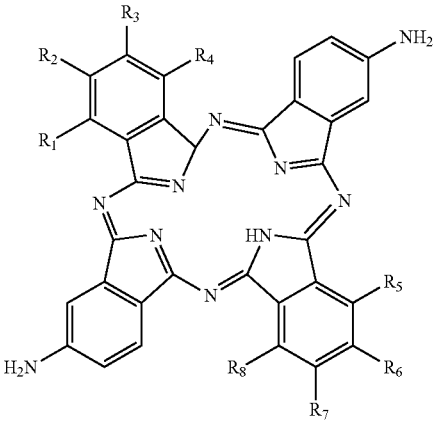

or

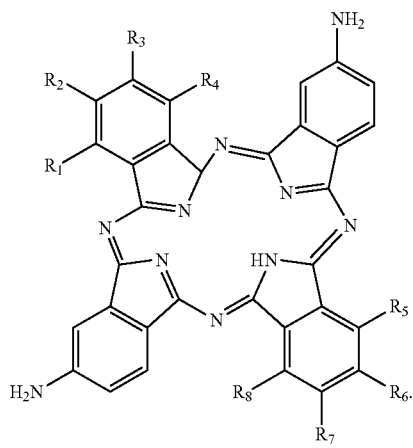

A structural formula of the compound C2 is

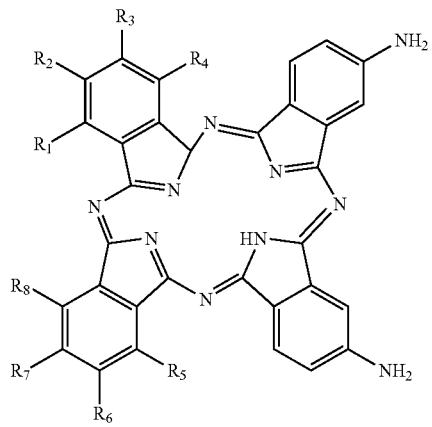

or

-continued

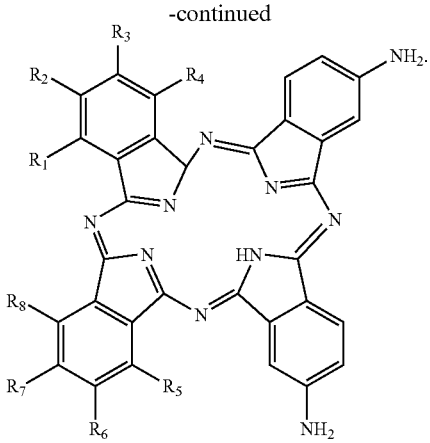

In the embodiment, the third reaction temperature may range from 70° C. to 110° C., and preferably range from 75° C. to 100° C.

The second reaction time can range from 10 to 32 hours, and preferably 12 to 30 hours.

A reason for a selection of the third reaction temperature and the second reaction time in the embodiment is the same as or similar to a reason for a selection of the first reaction temperature and the first reaction time, which is not repeated herein.

Referring to FIG. 4, the step S2 further comprises:
S24: rotarily evaporating the first mixture to obtain a second crude product, and rotarily evaporating a filtrate obtained by leaching the second crude product by a second eluent to obtain the purified compound C1 or the purified compound C2.

In the embodiment, the second eluent can be a mixed solution of dichloromethane and ethyl acetate.

Wherein, a volume ratio of dichloromethane and ethyl acetate ranges from 6:1 to 14:1, and preferably 8:1 to 12:1. When the volume ratio of dichloromethane and ethyl acetate is less than 6:1 or greater than 14:1, an amount of the purified compound C which can be obtained after leaching the second crude product and rotarily evaporating is too small, thereby causing the yield of the compound C to decrease. When the volume ratio of dichloromethane and ethyl acetate ranges from 8:1 to 12:1, the yield of the purified compound C obtained after the step S24 is the maximum.

Figure 5:
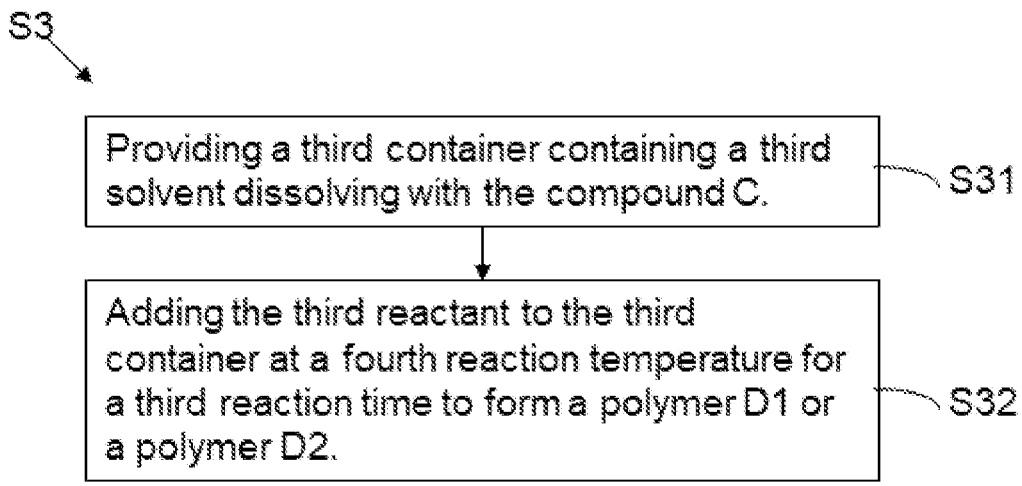
FIG. 5 is a flowchart of a step S3 of a manufacturing method of a thin film material according to an embodiment of the present disclosure.

Referring to FIG. 5, the step S3 comprises:
S31: providing a third container containing a third solvent dissolving with the compound C; and
S32: adding the third reactant to the third container at a fourth reaction temperature for a third reaction time to form a polymer D1 or a polymer D2.

In the embodiment, the third solvent can be a solvent that could dissolve the compound C and the third reactant, such as N-methylpyrrolidone.

In the embodiment, the fourth reaction temperature may range from 15° C. to 30° C., and is preferably 25° C.

In the embodiment, the third reaction time can range from 12 to 108 hours, and preferably 24 to 96 hours.

A reason for a selection of the fourth reaction temperature and the third reaction time in the embodiment is the same as or similar to a reason for a selection of the first reaction temperature and the first reaction time, which is not repeated herein.

In the embodiment, a structural formula of the polymer D1 is:

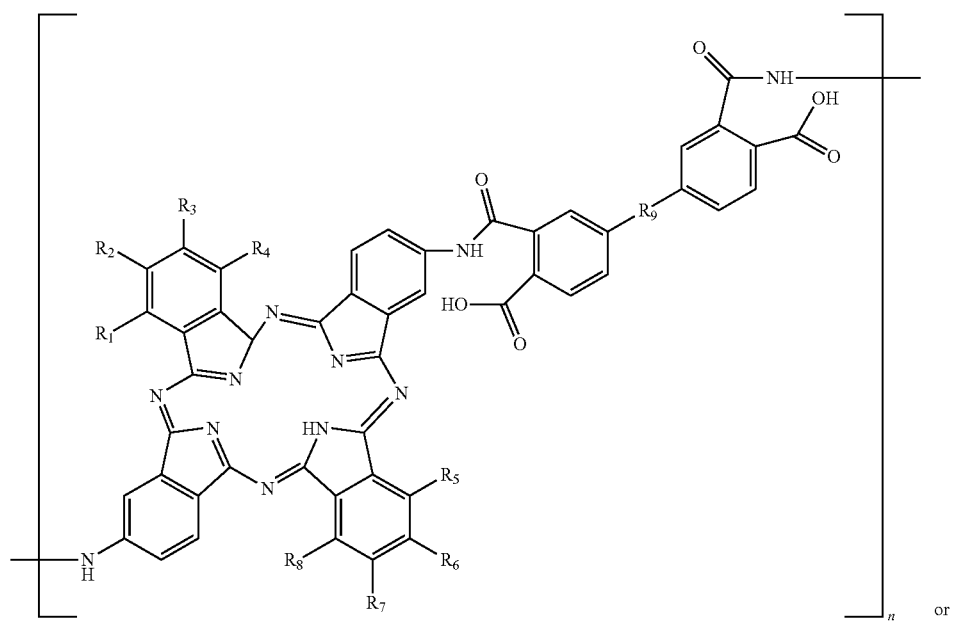

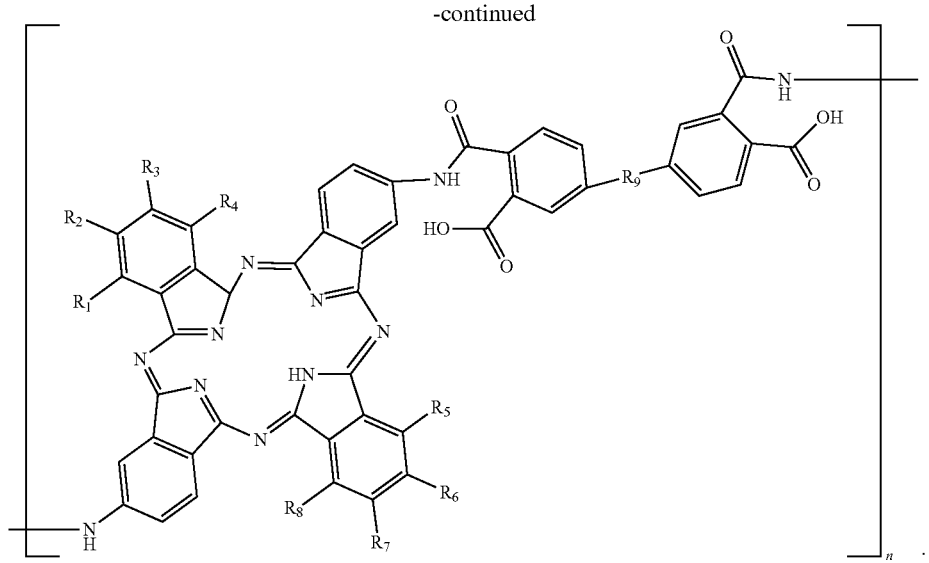
In the embodiment, a structural formula of the polymer D2 is:
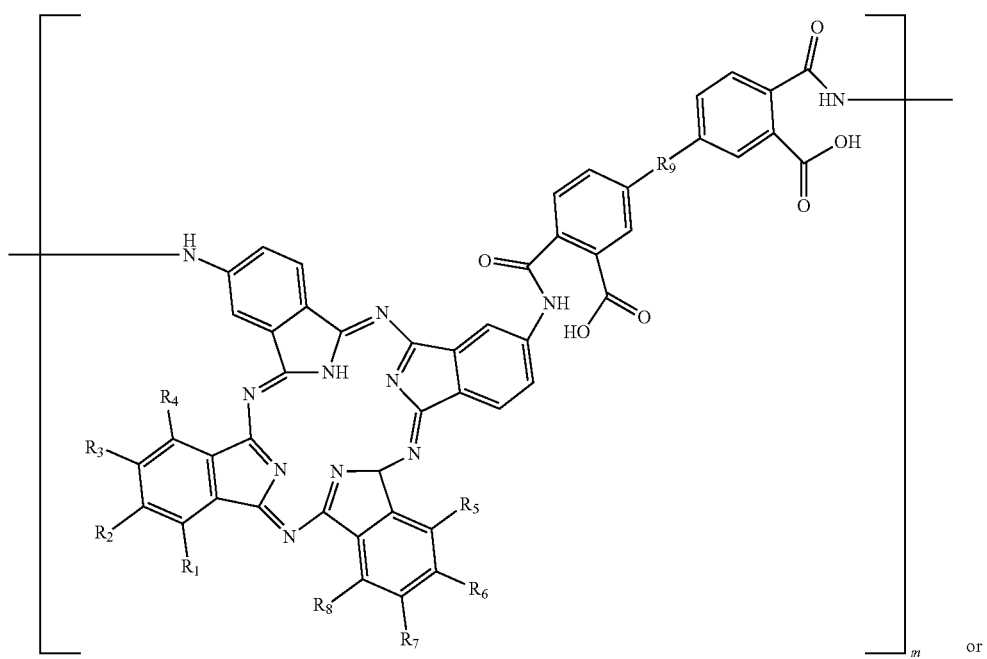
or

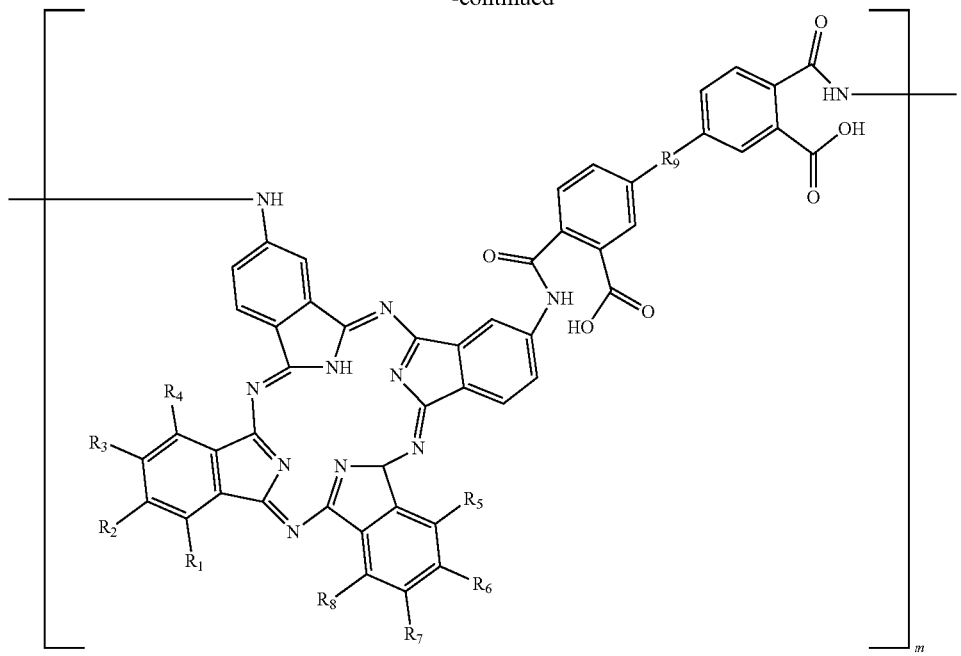

In the embodiment, the third reactant can be a fluorine-containing dianhydride compound.

The third reactant can be one of following compounds:

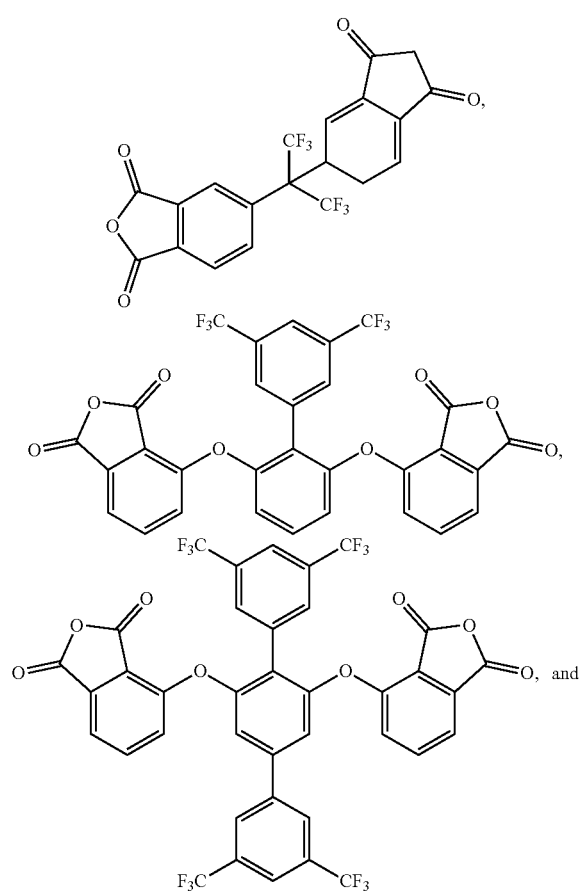

-continued

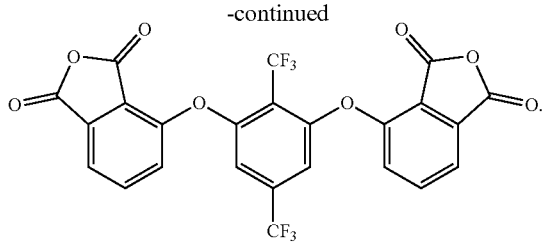

Figure 6:
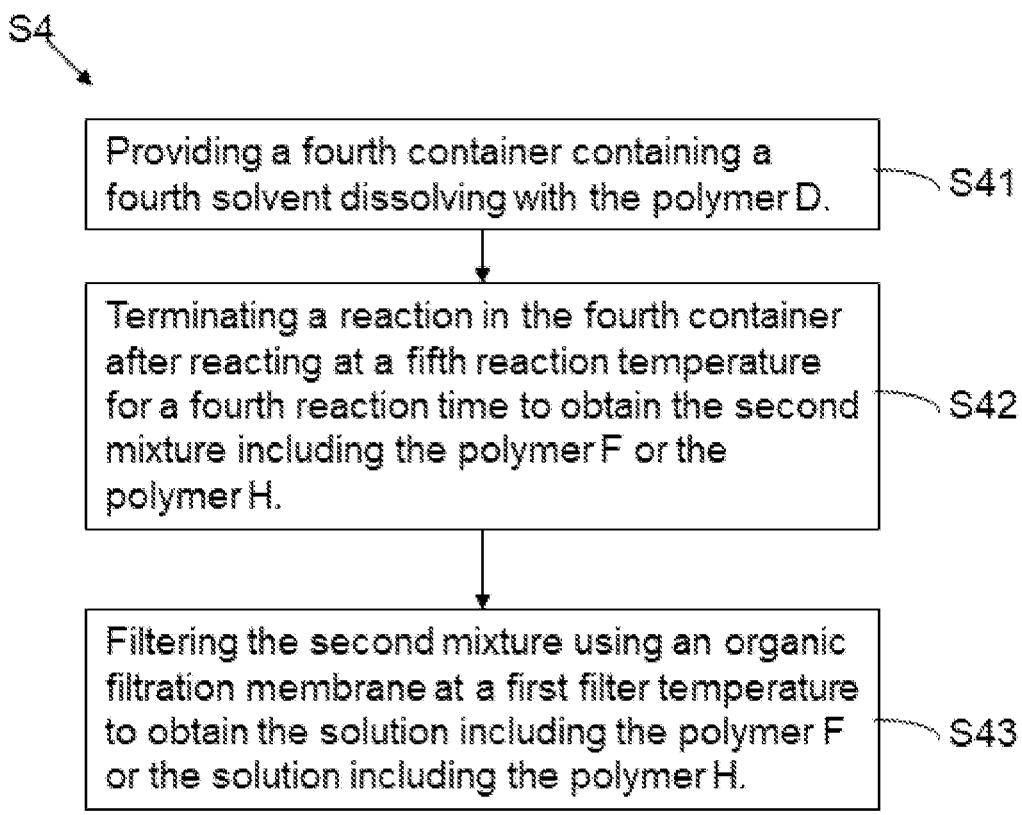
FIG. 6 is a flowchart of a step S4 of a manufacturing method of a thin film material according to an embodiment of the present disclosure.

Referring to FIG. 6, the step S4 comprises:

S41: providing a fourth container containing a fourth solvent dissolving with the polymer D.

In the embodiment, the fourth solvent can be toluene.

In the embodiment, a volume of the fourth solvent can range from 5 ml to 110 ml.

S42: terminating a reaction in the fourth container after reacting at a fifth reaction temperature for a fourth reaction time to obtain the second mixture including the polymer F or the polymer H.

In the embodiment, the fifth reaction temperature may range from 120° C. to 270° C., and preferably 150° C. to 250° C.

The fourth reaction time can range from 3 to 7 hours, and preferably 4 to 6 hours.

A reason for a selection of the fifth reaction temperature and the fourth reaction time in the embodiment is the same as or similar to a reason for a selection of the first reaction temperature and the first reaction time, which is not repeated herein.

S43: filtering the second mixture using an organic filtration membrane at a first filter temperature to obtain the solution including the polymer F or the solution including the polymer H.

In the embodiment, the first filter temperature can range from 70° C. to 90° C., and is preferably 80° C. When the first filter temperature is less than 70° C., the polymer F or the polymer H would precipitate, thereby causing the yield of the polymer F or the polymer H to decrease. When the first filter temperature is greater than 90° C., by-products in the second mixture would incompletely precipitate, thereby causing the obtained solution including the polymer F or the polymer H to have impurities. When the first filter temperature is 80° C., the polymer F or the polymer H would not precipitate and the by-products in the second mixture could completely precipitate.

Figure 7:
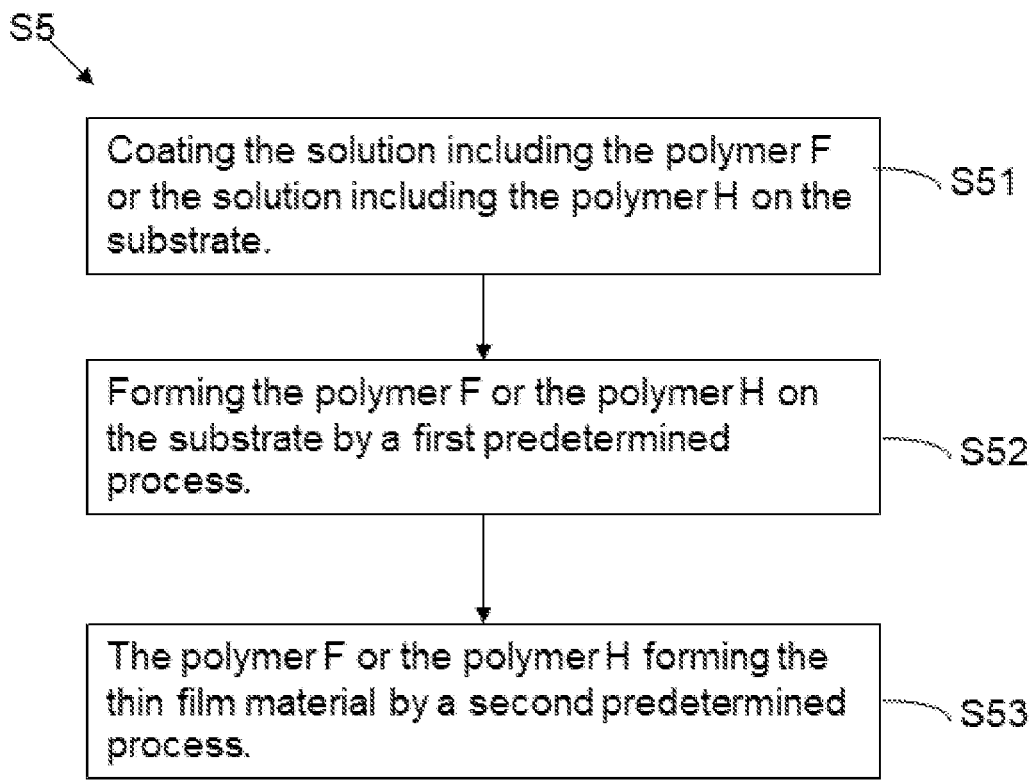
FIG. 7 is a flowchart of a step S5 of a manufacturing method of a thin film material according to an embodiment of the present disclosure.

Referring to FIG. 7, the step S5 comprises:

S51: coating the solution including the polymer F or the solution including the polymer H on the substrate.

In the embodiment, the substrate can be a glass substrate.

S52: forming the polymer F or the polymer H on the substrate by a first predetermined process.

Figure 8:
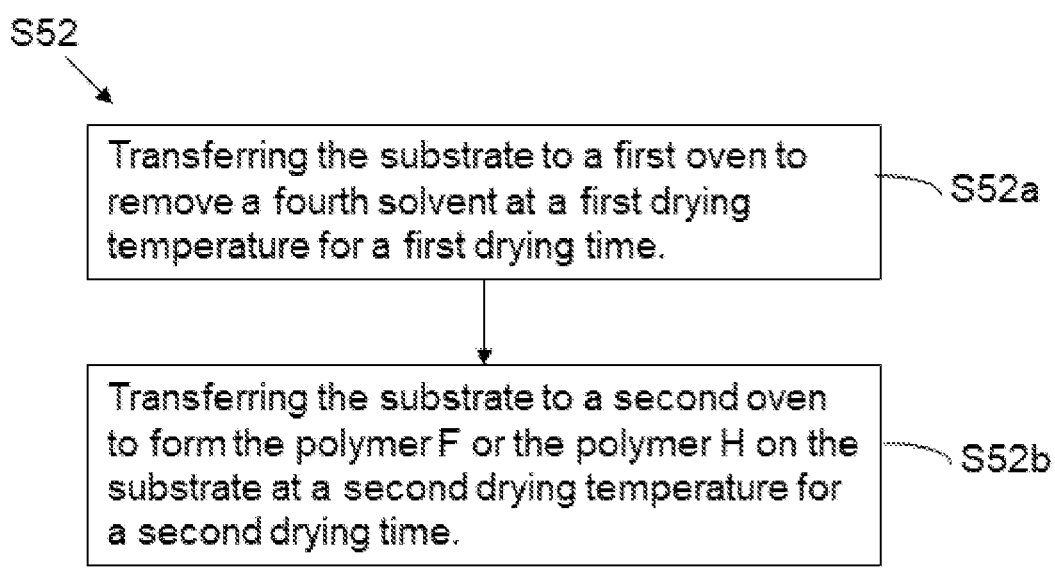
FIG. 8 is a flowchart of a step S52 of a manufacturing method of a thin film material according to an embodiment of the present disclosure.

Referring to FIG. 8, in the embodiment, the step S52 comprises:

S52a: transferring the substrate to a first oven to remove a fourth solvent at a first drying temperature for a first drying time.

In the embodiment, the first oven can be an oven having a vacuum environment.

In the embodiment, the first drying temperature can range from 70° C. to 90° C., and is preferably 80° C.

In the embodiment, the first drying time can range from 0.2 hour to 1.2 hours, and preferably 0.5 hour to 1.5 hours.

In the embodiment, an amount of the fourth solvent removed in the step S52a can range from 60% to 80% of the fourth solvent in the solution including the polymer F or in the solution including the polymer H, and is preferably 70%.

When the amount of the fourth solvent removed in the step S52a is less than 60%, the amount of the fourth solvent remaining on the substrate is excessive, which is unfavorable for cross-linking and curing of the polymer F or the polymer H in the step S52b. When the amount of the fourth solvent removed in the step S52a is greater than 80%, the amount of the fourth solvent remaining on the substrate is too small, which causes a less solvent for cross-linking and curing of the polymer F or the polymer H in the step S52b, thereby making the formed thin film material have defects such as cracks.

S52b: transferring the substrate to a second oven to form the polymer F or the polymer H on the substrate at a second drying temperature for a second drying time.

In the embodiment, the second oven can be a muffle furnace.

In the embodiment, the second drying temperature can range from 400° C. to 520° C., and preferably 420° C. to 500° C.

In the embodiment, the second drying time can range from 2 hours to 6 hours.

S53: the polymer F or the polymer H forming the thin film material by a second predetermined process.

In the embodiment, the second predetermined process comprises immersing the substrate formed with the polymer F or the polymer H into a third separating agent, separating the substrate from the polymer F or the polymer H after a first soaking time, and transferring the separated polymer F or the polymer H to a third oven to obtain the thin film material after drying at a third drying temperature.

In the embodiment, the third separating agent can be deionized water.

In the embodiment, the first soaking time can range from 60 hours to 108 hours, and preferably 72 hours to 96 hours.

When the first soaking time is less than 60 hours, the polymer F or the polymer H cannot be completely separated from the substrate, thereby causing the obtained thin film material to have defects such as damage. When the first soaking time is greater than 108 hours, the soaking time is too long, thereby affecting a manufacturing efficiency of the thin film material. When the first soaking time ranges from 72 hours to 96 hours, the polymer F or the polymer H can be completely separated from the substrate, and the manufacturing efficiency of the thin film material can be ensured.

In the embodiment, the third drying temperature can range from 70° C. to 90° C., and is preferably 80° C.

Specific embodiments are used to describe technical solutions of the present disclosure.

Embodiment 1

S1: in a first container, a compound A and a first reactant reacting to form a compound B.

In the embodiment, the step S1 comprises:

S11: providing a first container containing trifluoroacetic acid with a volume ranging from 12 ml to 50 ml dissolving with the compound A having an amount ranging from 0.3 mol to 1.1 mol.

In the embodiment, the compound A may be

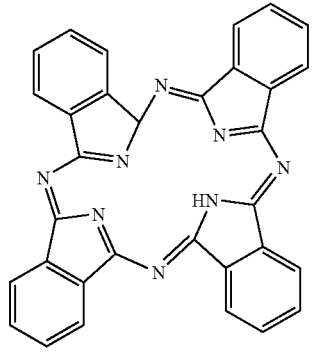

S12: adding a solution containing 2 ml to 5 ml of the trifluoroacetic acid and 0.1 mol to 2.5 mol of sodium nitrite to the first container drop by drop, and forming a compound B1 at 25° C. for 12 to 30 minutes.

S13: adding 100 ml of deionized water in the first container, then stirring, and setting aside.

S14: adding dichloromethane in the first container, then extracting, collecting an organic layer, and rotarily evaporating to obtain a first crude product including the compound B1 or the compound B2.

S15: leaching the first crude product by a mixed solution of dichloromethane and petroleum ether with a volume ratio of 5:3, and rotarily evaporating to obtain the purified compound B1.

The structural formula of the compound B1 is:

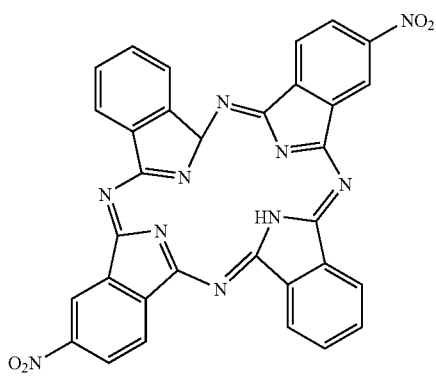

or

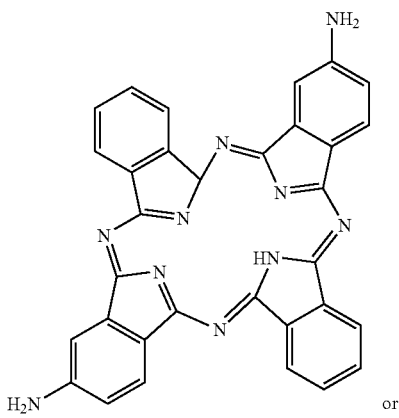

The structural formula of the compound C1 is:

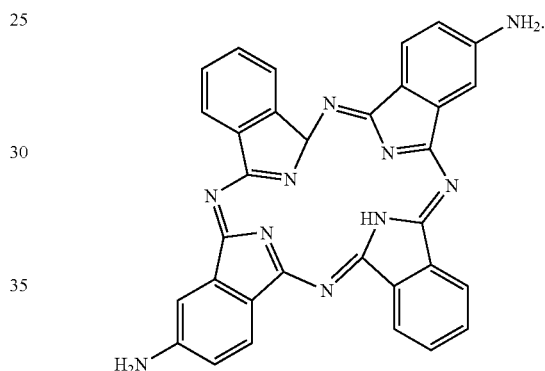

or

S2: in a second container, the compound B and a second reactant reacting to form a compound C.

In the embodiment, the step S2 comprises:

S21: providing a second container containing 10 ml to 40 ml of trifluoroacetic acid dissolving with the compound B S22: adding 0.1 mol to 2.3 mol of hydrazine dihydrochloride to the second container slowly at 40° C. to 60° C.

S23: terminating the reaction in the second container after reacting at a temperature ranging from 75° C. to 100° C. for 12 hours to 30 hours to obtain a first mixture including a compound C1.

S24: rotarily evaporating the first mixture to obtain a second crude product, and rotarily evaporating a filtrate obtained by leaching the second crude product by a mixed solution of dichloromethane and ethyl acetate with a volume ratio ranging from 8:1 to 12:1 to obtain the purified compound C1.

S3: in a third container, the compound C and a third reactant reacting to form a polymer D.

In the embodiment, the step S3 comprises:

S31: providing a third container containing N-methylpyrrolidone dissolving with 1 mol to 4.7 mol of the compound C.

S32: adding 0.5 mol to 9.5 mol of the third reactant to the third container at 25° C. for 24 hours to 96 hours to form a polymer D1.

The third reactant is

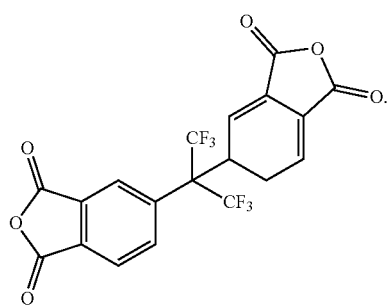 [SMILES: O=C1OC(=O)C2=CC(C(c3ccc4c(c3)C(=O)OC4=O)(C(F)(F)F)C(F)(F)F)CC=C12]

The structural formula of the polymer D1 is:

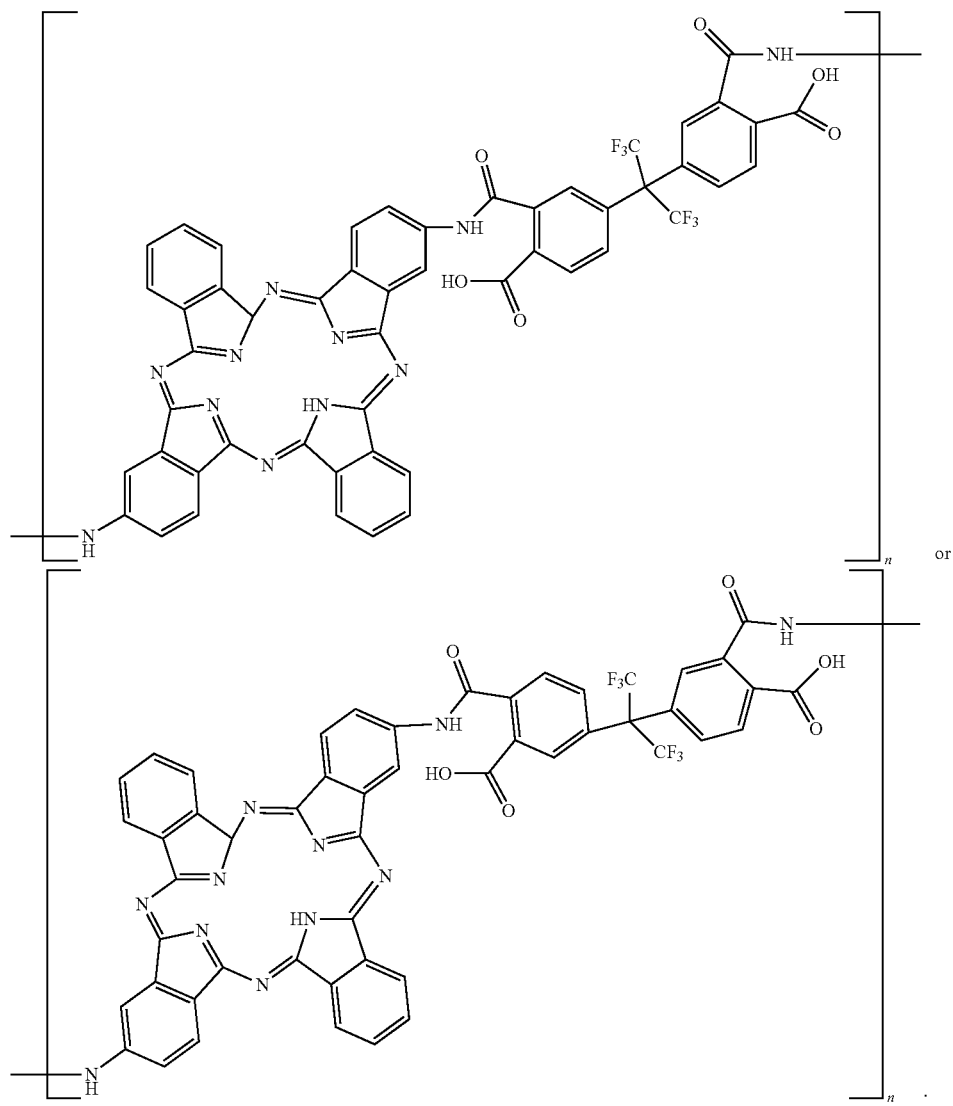

S4: in a fourth container, the polymer D reacting to obtain a second mixture including a polymer F or a polymer H.

In the embodiment, the step S4 comprises:

S41: providing a fourth container containing 10 ml to 105 ml of toluene dissolving with the polymer D.

S42: terminating the reaction in the fourth container after reacting at a temperature ranging from 150° C. to 250° C. for 4 hours to 6 hours to obtain the second mixture including the polymer F or the polymer H.

S43: filtering the second mixture using an organic filtration membrane at 80° C. to obtain the solution including the polymer F or the solution including the polymer H.

S5: a solution including the polymer F or a solution including the polymer H forming the polymer F or the polymer H on a substrate.

In the embodiment, the step S5 comprises:

S51 coating the solution including the polymer F or the solution including the polymer H on a glass substrate.

S52: forming the polymer F or the polymer H on the substrate by a first predetermined process.

In the embodiment, the step S52 comprises:

S52a: transferring the substrate to an oven having a vacuum environment to remove 70% of toluene at 80° C. for 0.5 hour to 1 hour.

S52b: transferring the substrate to a muffle furnace to form the polymer F or the polymer H on the substrate at a temperature ranging from 420° C. to 450° C. for 3 hours to 5 hours.

In the embodiment, the substrate is transferred to the muffle furnace, a temperature in the muffle furnace ranges from 110° C. to 130° C., and is preferably 120° C. for 25 minutes to 35 minutes. Preferably, after 30 minutes, the temperature rises to 450° C. at a rate of 4° C./min to 10° C./min and is kept at 450° C. for about 1 hour, and then decreases to 120° C. at a rate of 5° C./min to 10° C./min, preferably at a rate of 7° C./min to take out the substrate.

S53: the polymer F or the polymer H forming the thin film material by a second predetermined process.

In the embodiment, the second predetermined process comprises immersing the substrate formed with the polymer F into deionized water, separating the substrate from the polymer F or the polymer H after soaking for 72 hours to 96 hours, and transferring the separated polymer F or the polymer H to a third oven to obtain the thin film material after drying at 80° C.

In the embodiment, the structural formula of the polymer F is:

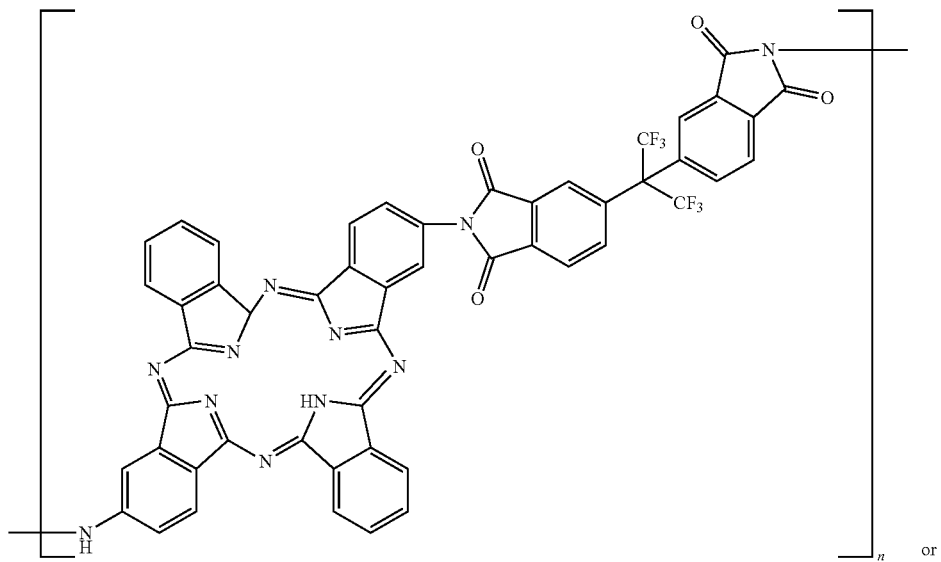

or

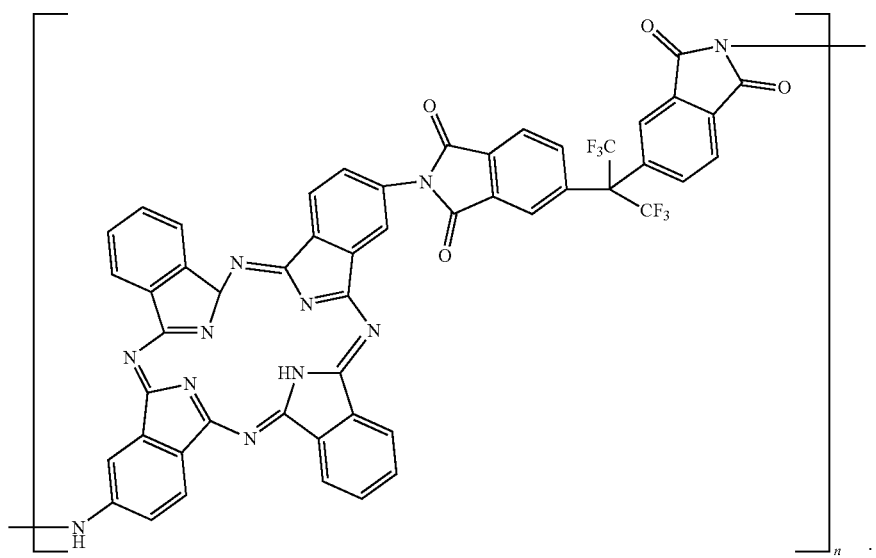

.

Embodiment 2

The embodiment is the same as or similar to embodiment 1. The difference is that:

In the embodiment, the step S12 comprises:

S12: adding 2 ml to 5 ml of the trifluoroacetic acid solution containing 0.1 mol to 2.5 mol of sodium nitrite to the first container at one time, and forming a compound B2 at 25° C. for 12 to 30 minutes.

The structural formula of the compound B2 is:
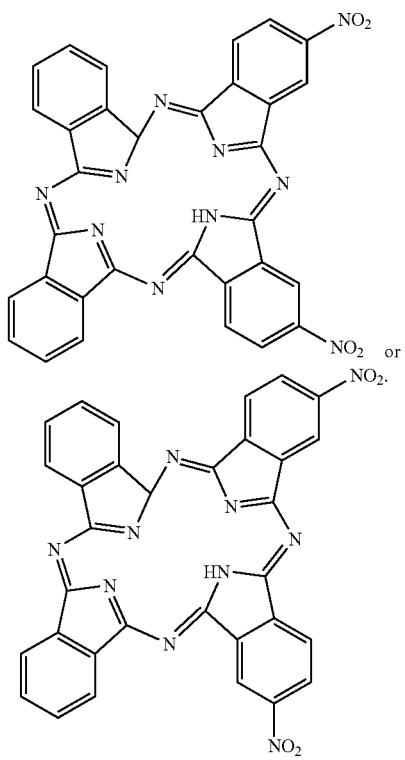
In the embodiment, the structural formula of the compound C is:
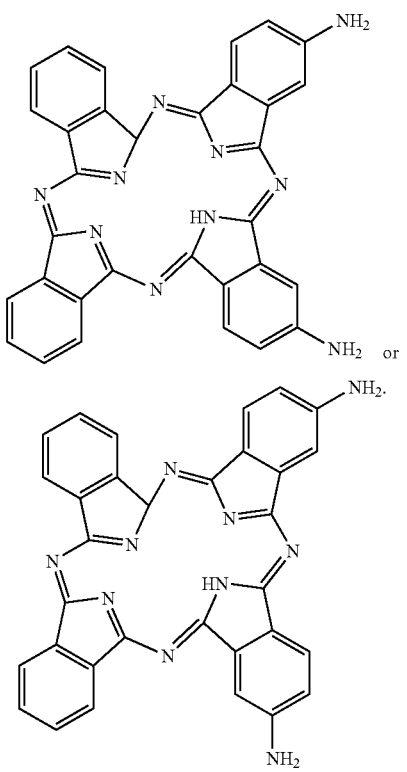
In the embodiment, the structural formula of the compound D is:
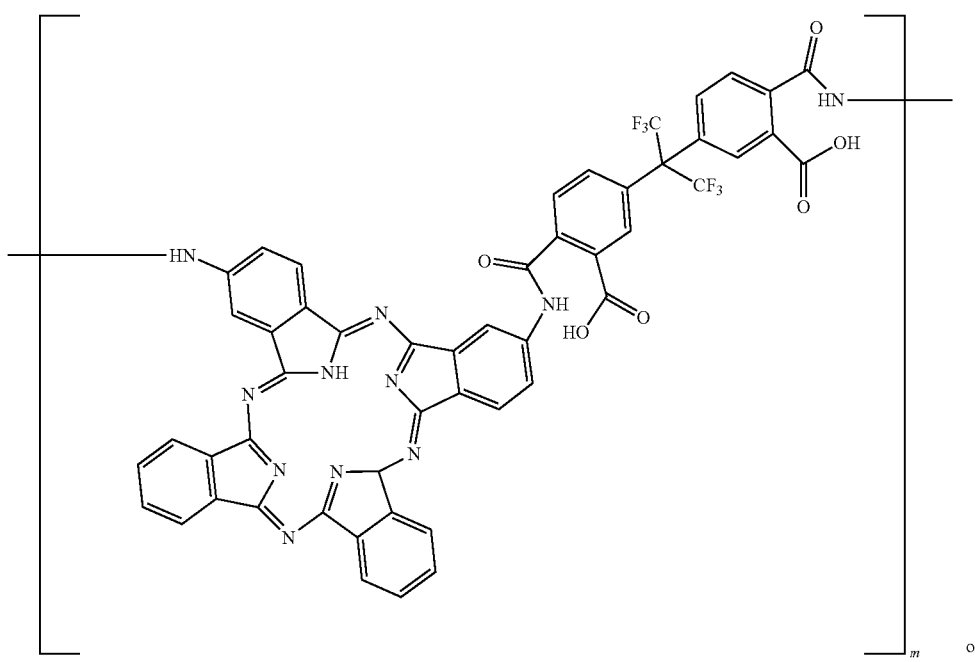
or -continued
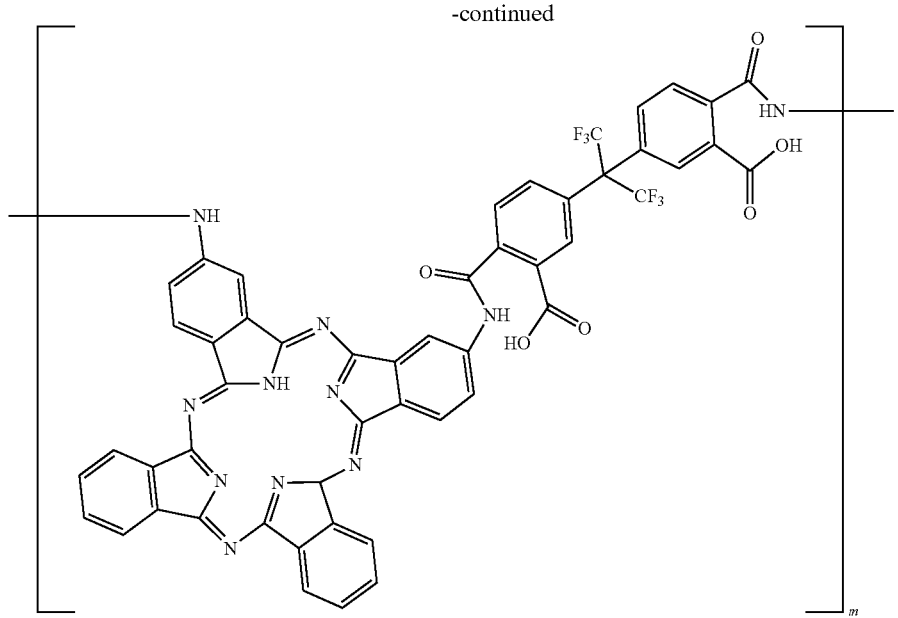
In the embodiment, the structural formula of the polymer H is:
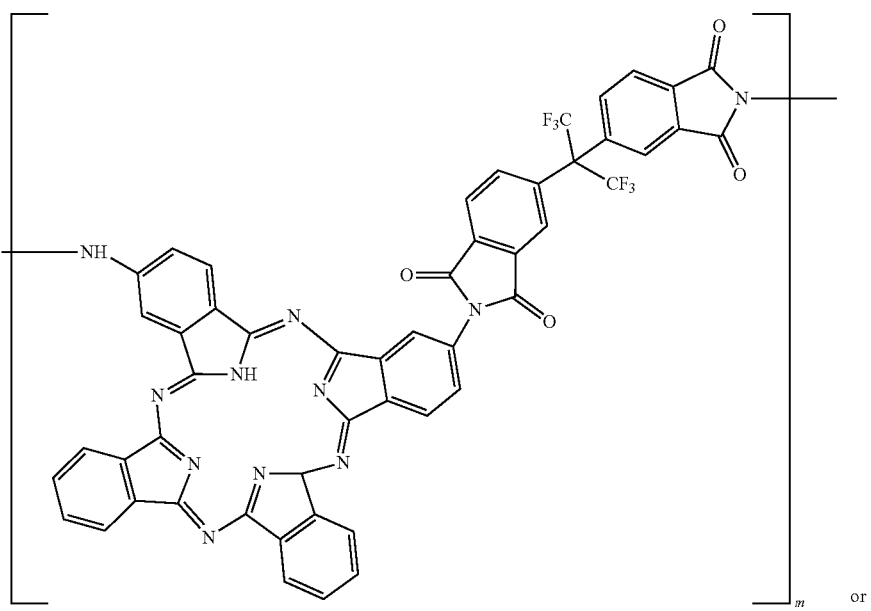
or -continued

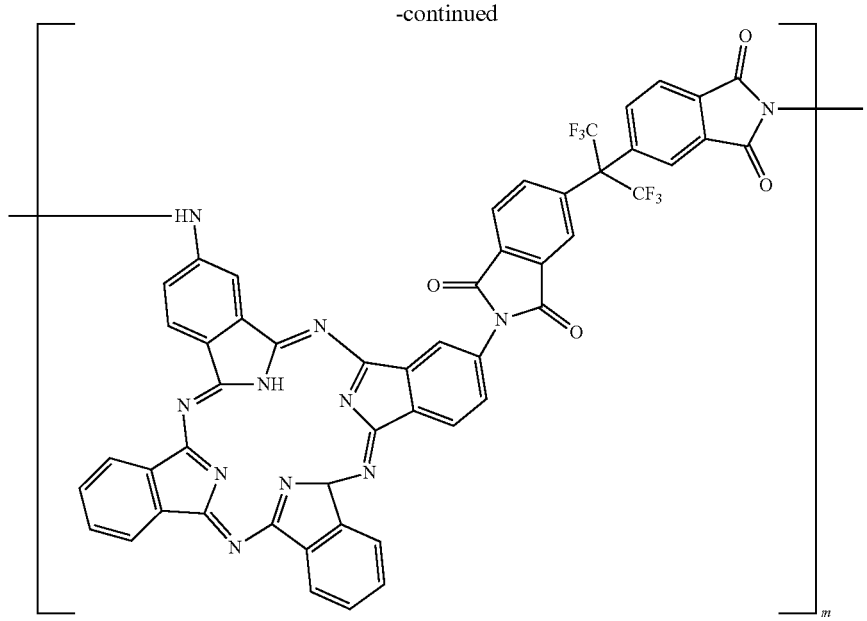

Embodiment 3

The embodiment is the same as or similar to the above embodiments. The difference is that:

S52b: transferring the substrate to a muffle furnace to form the polymer F or the polymer H on the substrate at a temperature ranging from 420° C. to 500° C. for 3 hours to 5 hours.

In the embodiment, the substrate is transferred to the muffle furnace, a temperature in the muffle furnace ranges from 110° C. to 130° C., and is preferably 120° C. for 10 minutes to 35 minutes. The temperature rises to 160° C. to 200° C. at a rate of 2° C./min to 4° C./min, preferably, after 180° C., the temperature is kept for 15 minutes to 25 minutes, then increases to 220° C. to 380° C. for 15 minutes to 25 minutes at a rate of 1° C./min to 8° C./min, then increases to 420° C. to 500° C. for 15 minutes to 50 minutes at a rate of 2° C./min to 12° C./min, and then decreases to 110° C. to 130° C. at a rate of 5° C./min to 10° C./min, preferably below 120° C., to take out the substrate.

In the above embodiment, synthesis of the compound B, the compound C, the polymer D, the polymer F, or the polymer H are performed at an inert atmosphere. The inert atmosphere can be formed by argon filling in a reaction container.

In the embodiment, the compound A, the first reactant, the second reactant, and the third reactant can be obtained through commercial channels.

The present disclosure further provides a thin film material which comprises the polymer F or the polymer H.

The structural formula of the polymer F is:

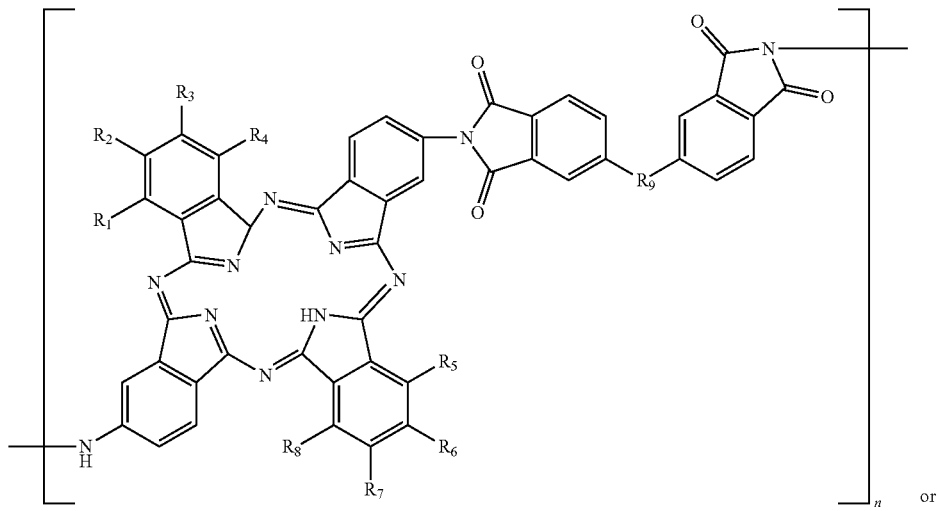

or

-continued
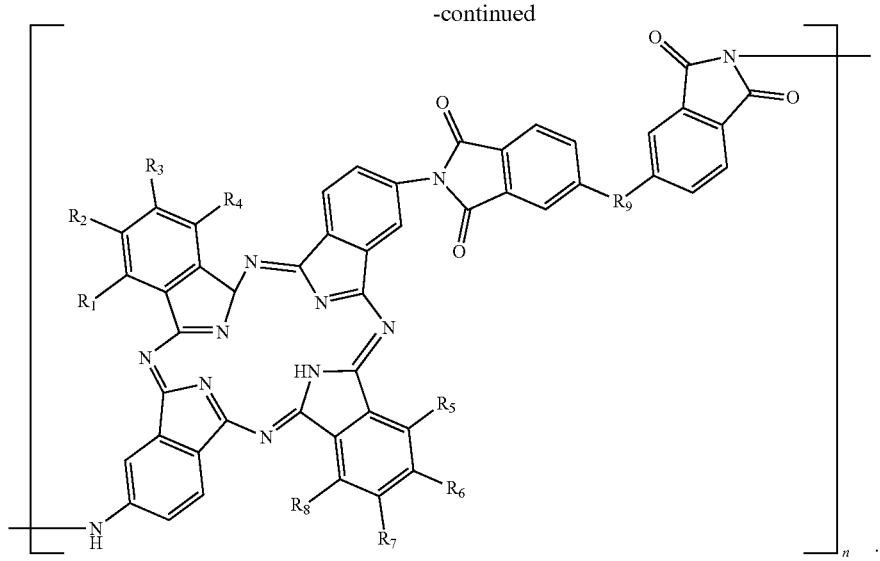
The structural formula of the polymer H is:
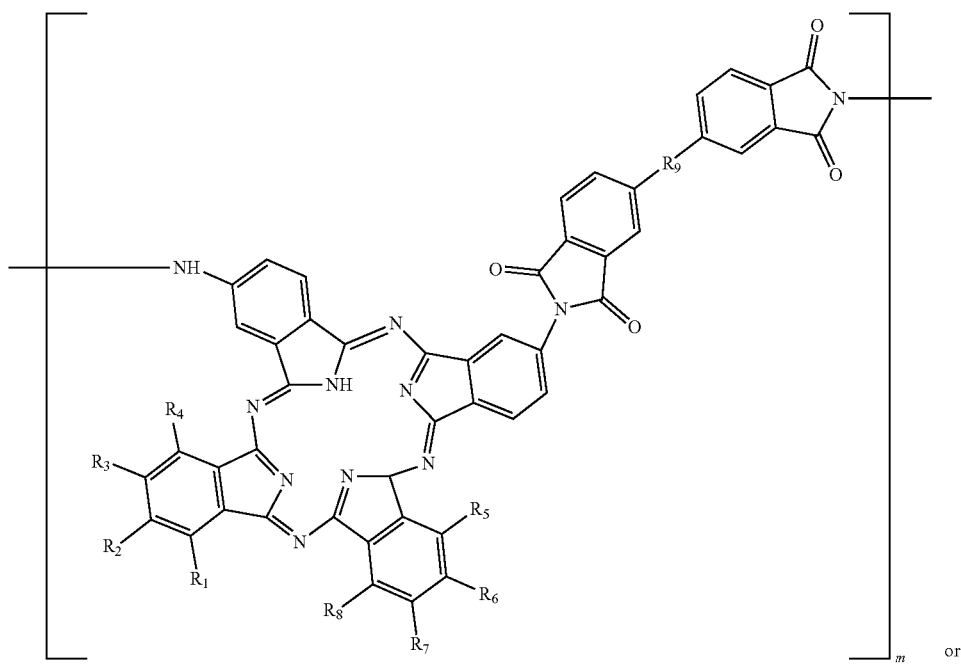
or

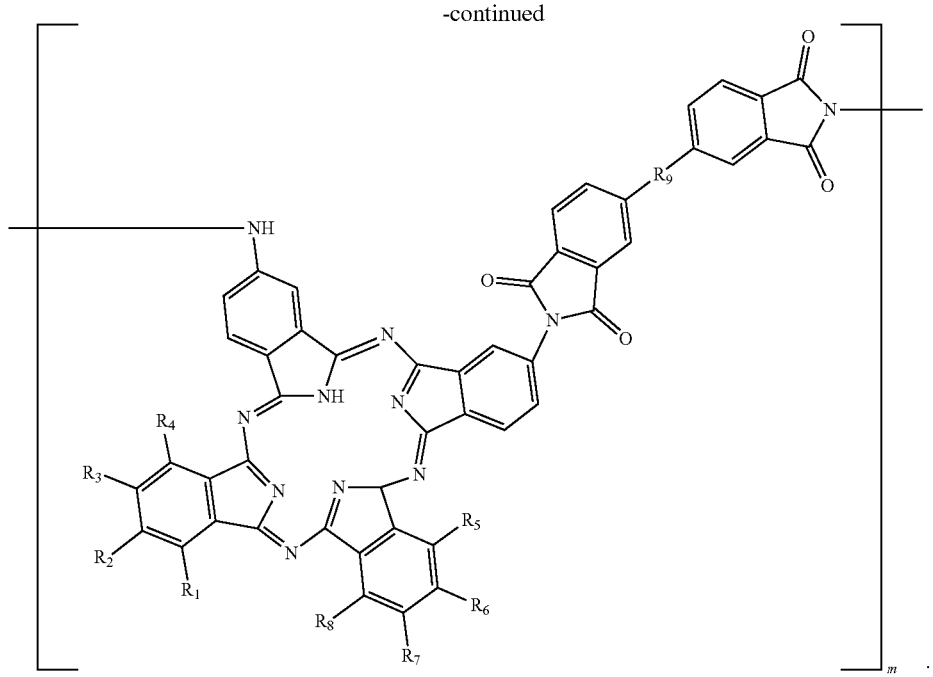
Wherein, R1, R2, R3, R4, R5, R6, R7, and R8 are independently a hydrogen atom or an aliphatic alkyl group, and R9 is a fluorine-containing group.
In the embodiment, the structural formula of the polymer F can be:
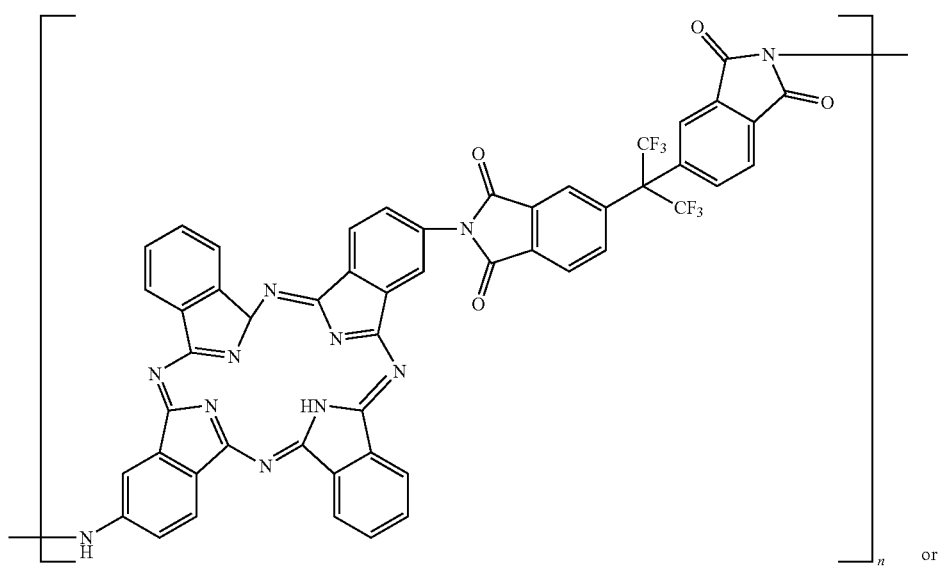
or

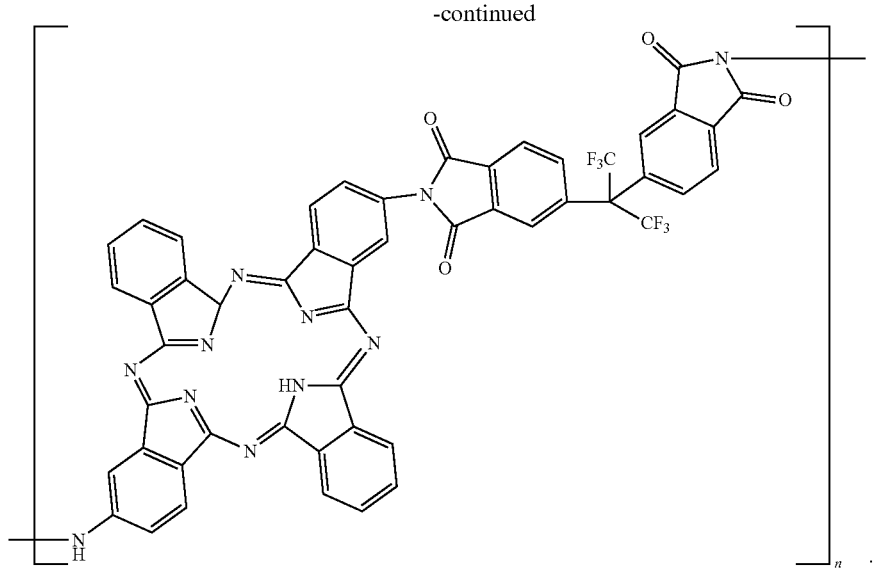
The structural formula of the polymer H can be:
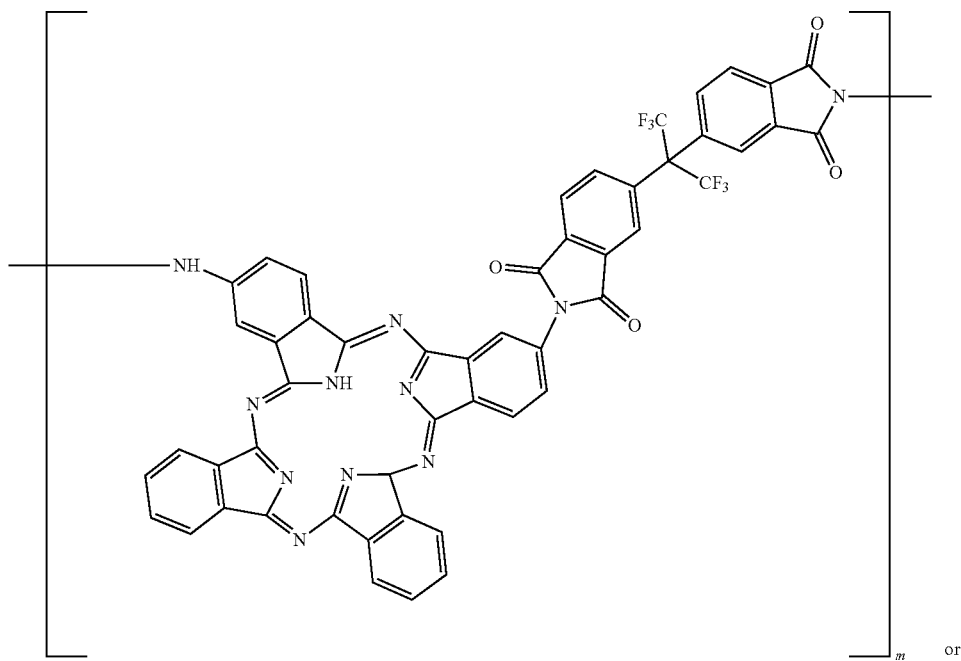
or

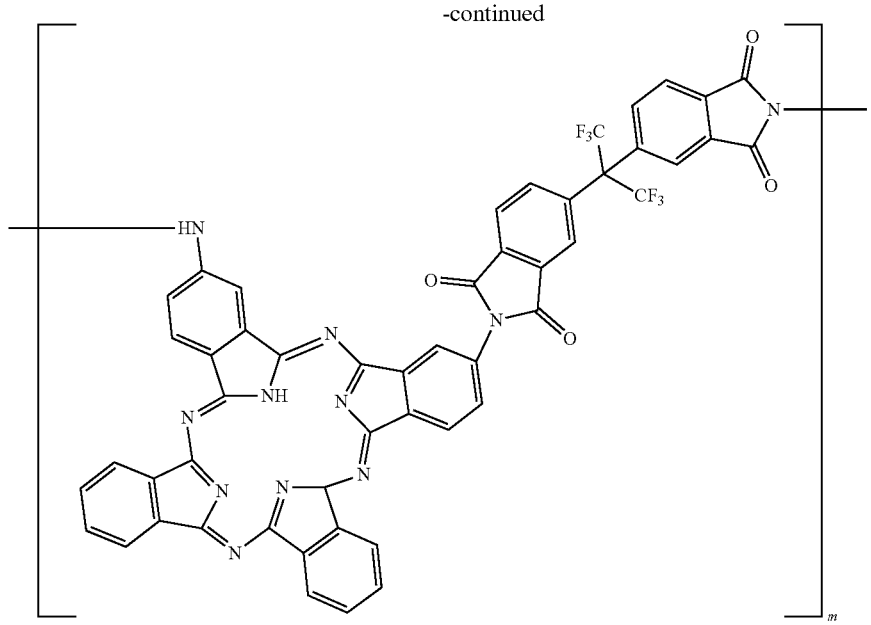

Figure 9:
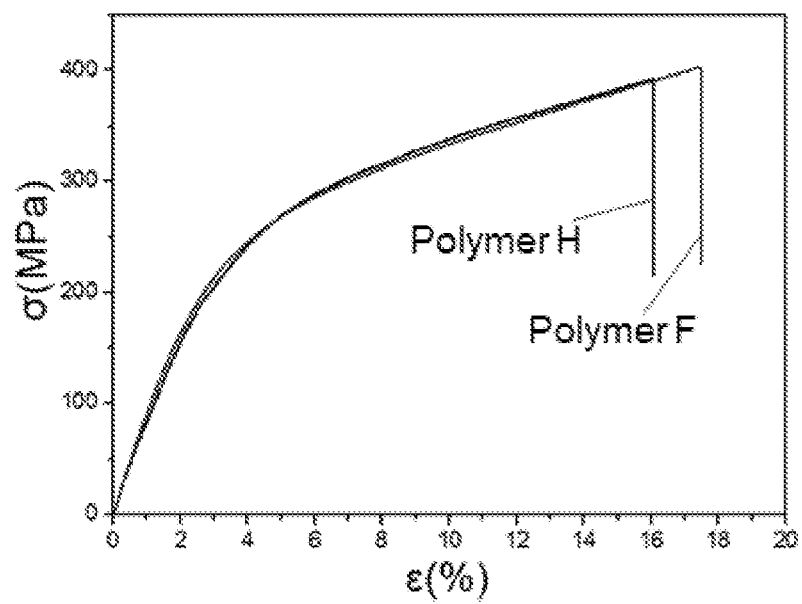
FIG. 9 is a tensile performance curve diagram of a polymer F and a polymer H of a thin film material according to an embodiment of the present disclosure.

Referring to FIG. 9, in the embodiment, a tensile performance curve of the polymer F or the polymer H shows that the maximum stress of the polymer F can achieve δF-max=389 MPa, εF-max=17.4%, and the maximum stress of the polymer H can achieve δH-max=374 MPa, εH-max=16.2%, which shows a good mechanical property.

Figure 10:
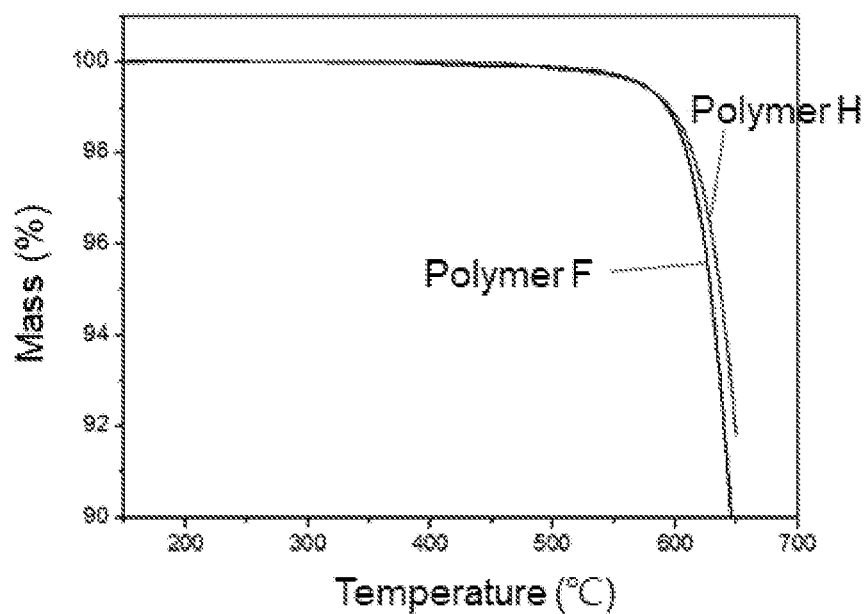
FIG. 10 is a thermogravimetric curve diagram of a polymer F and a polymer H of a thin film material according to an embodiment of the present disclosure.

Referring to FIG. 10, in the embodiment, a thermogravimetric curve of the polymer F or the polymer H demonstrates that when a weight loss is 1%, temperatures thereof are $T_F$=592.1° C., and $T_H$=594.8° C., which shows a good heat resistance.

Figure 11:
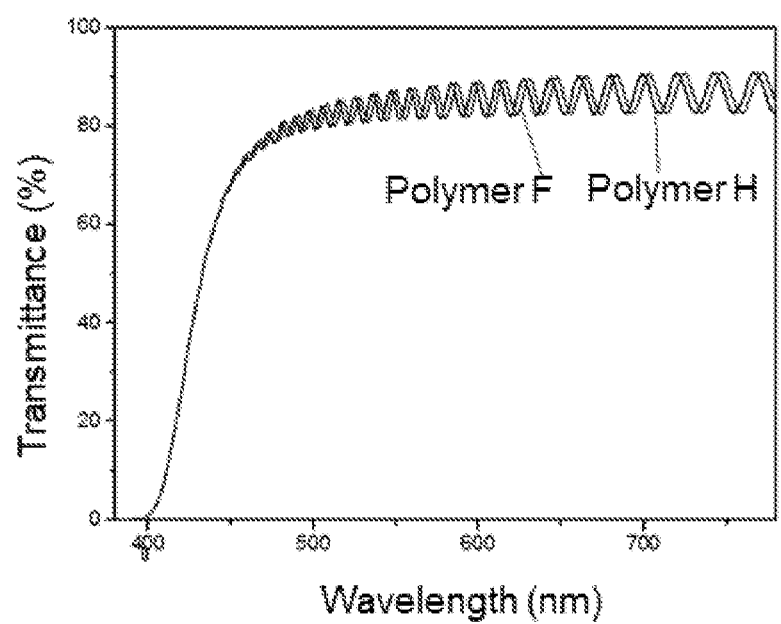
FIG. 11 is a light transmission performance diagram of a polymer F and a polymer H of a thin film material according to an embodiment of the present disclosure.

Referring to FIG. 11, in the embodiment, a light transmittance test of the polymer F or the polymer H shows that the light transmittance of the polymer F and the polymer H can achieve above 80% in most wavelengths, and can achieve above 85% in a big part of wavelengths.

The present disclosure provides the thin film material and the manufacturing method thereof. The manufacturing method of the thin film material comprises: in the first container, the compound A and the first reactant reacting to form the compound B; in the second container, the compound B and the second reactant reacting to form the compound C; in the third container, the compound C and the third reactant reacting to form the polymer D; in the fourth container, the polymer D reacting to obtain the second mixture including the polymer F or the polymer H; and the solution including the polymer F or the polymer H forming the polymer F or the polymer H on the substrate. The present disclosure manufactures a polyimide thin film material having pyridine rings as a main chain structure by a new manufacturing method of a thin film material, thereby effectively improving heat resistance, mechanical properties, and optical properties of the polyimide thin film material.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A manufacturing method of a thin film material, comprising:

S1: in a first container, a compound A and sodium nitrite in trifluoroacetic acid reacting to form a compound B;

S2: in a second container, the compound B and hydrazine dihydrochloride reacting to form a compound C;

S3: in a third container, the compound C and a fluorine-containing dianhydride compound reacting to form a polymer D;

S4: in a fourth container, the polymer D reacting to obtain a second mixture including a polymer F or a polymer H; and S5: a solution including the polymer F or a solution including the polymer H forming the polymer F or the polymer H on a substrate;

wherein a structural formula of the compound A is:

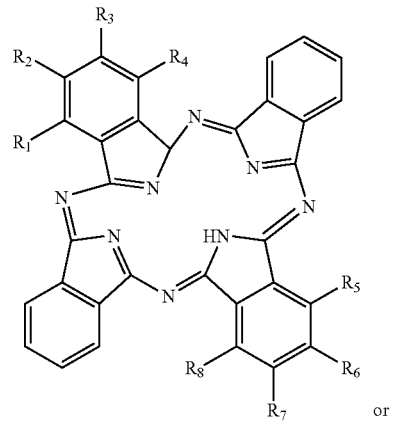

or

-continued
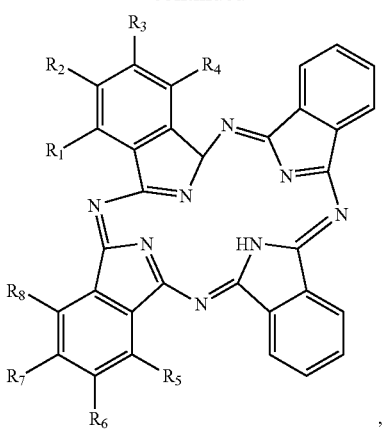
a structural formula of the polymer F is:
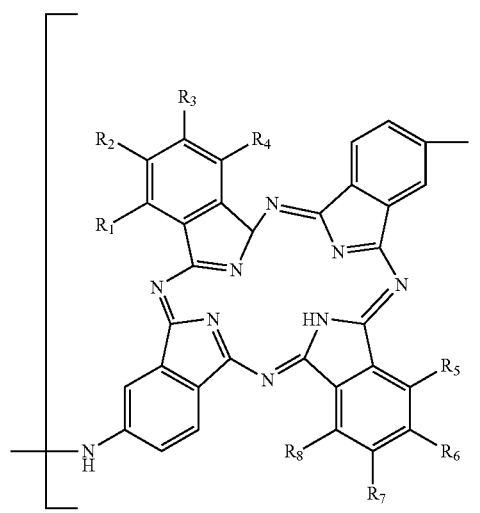
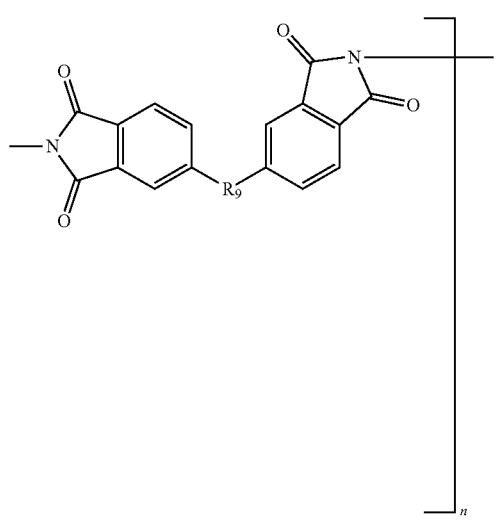
-continued
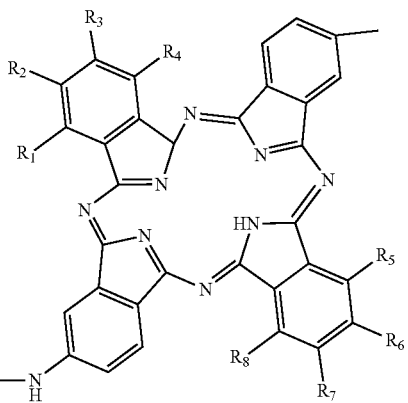
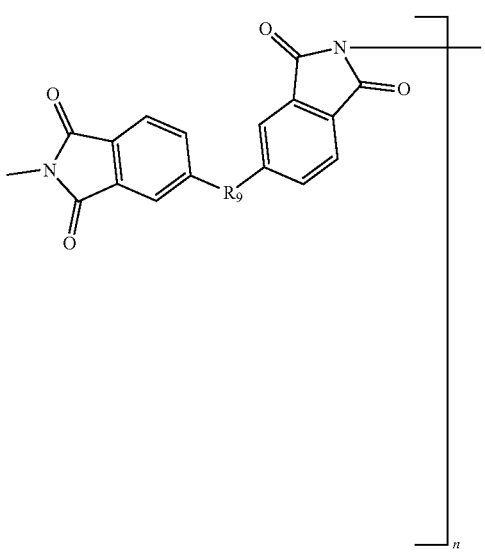

a structural formula of the polymer H is:

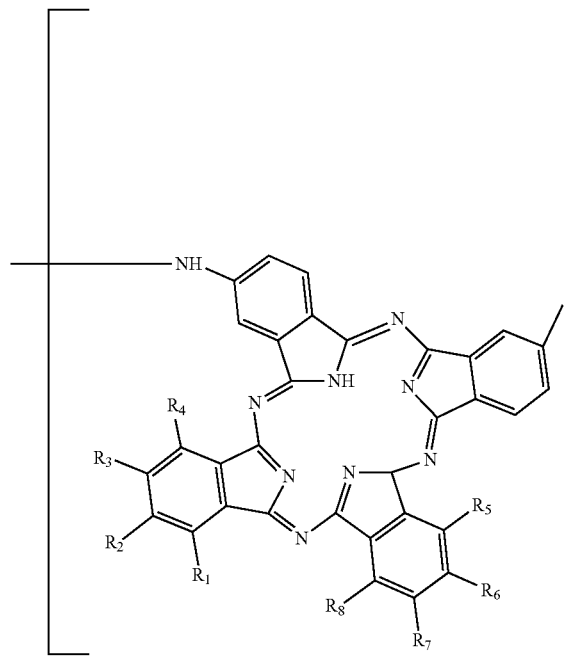

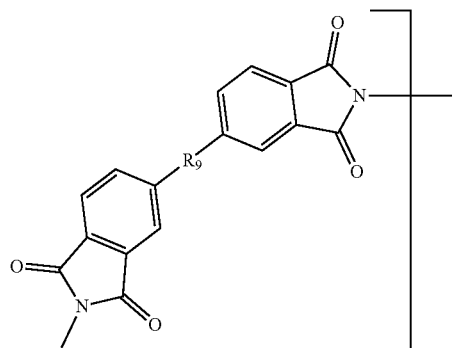

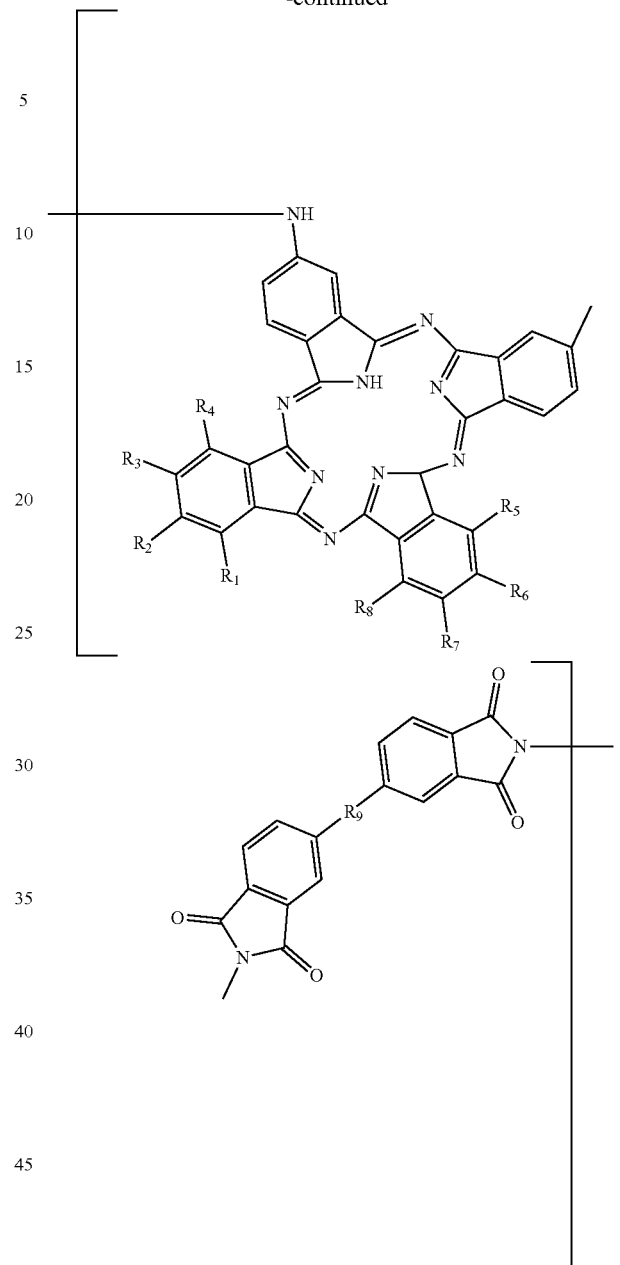

wherein $R_1$, $R_2$, $R_3$, $R_4$, $R_5$, $R_6$, $R_7$, and $R_8$ are independently a hydrogen atom or an aliphatic alkyl group, and $R_9$ is a fluorine-containing group.

2. The manufacturing method of the thin film material according to claim 1, wherein the step S1 comprises:

S11: providing a first container containing a first solvent dissolving with the compound A; and S12: adding the sodium nitrite in trifluoroacetic acid to the first container drop by drop and forming a compound B1 at a first reaction temperature for a first reaction time or adding the sodium nitrite in trifluoroacetic acid to the first container at one time and forming a compound B2 at a first reaction temperature for a first reaction time.

3. The manufacturing method of the thin film material according to claim 2, wherein a structural formula of the compound B1 is:

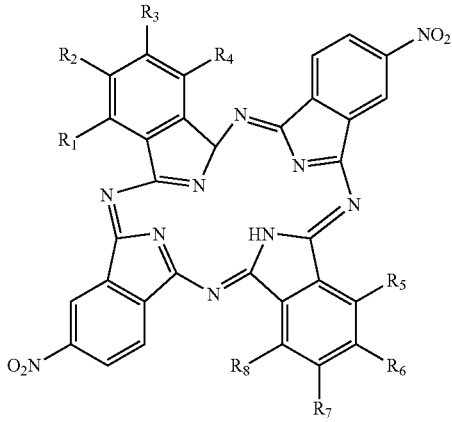

or

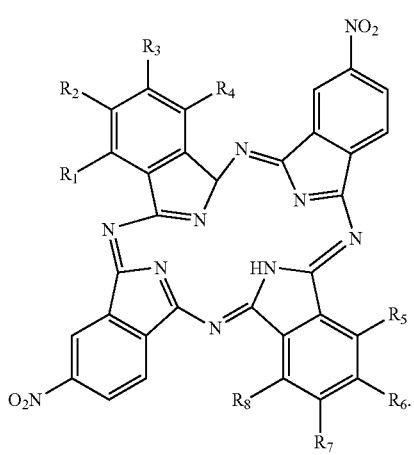

4. The manufacturing method of the thin film material according to claim 2, wherein a structural formula of the compound B2 is:

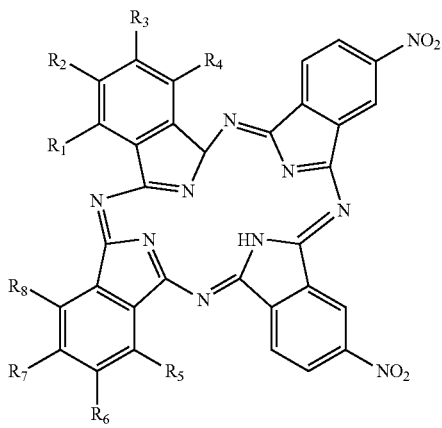

or

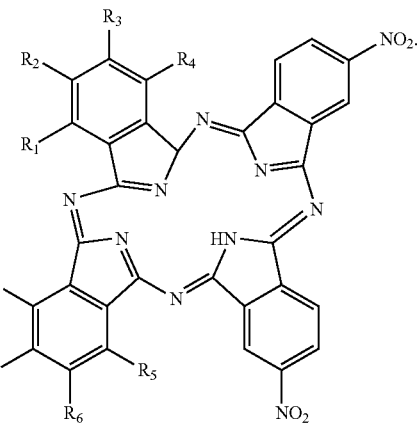

5. The manufacturing method of the thin film material according to claim 2, wherein the step S1 comprises:

S13: adding a first volume of a first separating agent in the first container, then stirring, and setting aside;

S14: adding a second volume of a second separating agent in the first container, then extracting, collecting an organic layer, and rotarily evaporating to obtain a first crude product including the compound B1 or the compound B2; and S15: leaching the first crude product by a first eluent and rotarily evaporating to obtain the purified compound B1 or the purified compound B2.

6. The manufacturing method of the thin film material according to claim 1, wherein the step S2 comprises:

S21: providing a second container containing a second solvent dissolving with the compound B;

S22: adding the hydrazine dihydrochloride to the second container slowly at a second reaction temperature; and S23: terminating a reaction in the second container after reacting at a third reaction temperature for a second reaction time to obtain a first mixture including a compound C1 or a compound C2.

7. The manufacturing method of the thin film material according to claim 6, wherein a structural formula of the compound C1 is:

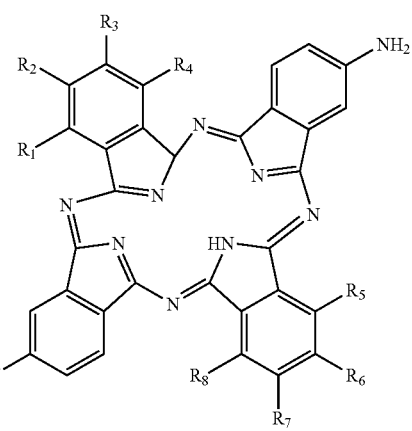

or

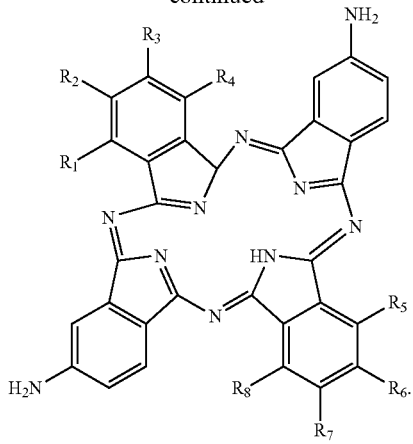

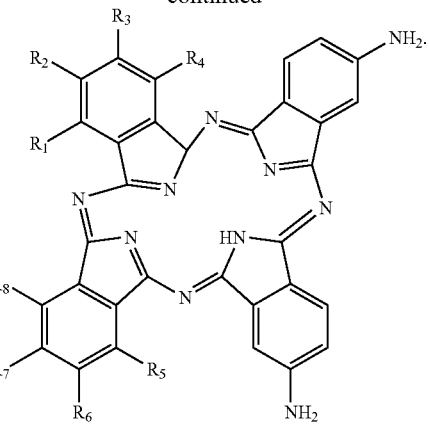

8. The manufacturing method of the thin film material according to claim 6, wherein a structural formula of the compound C2 is:

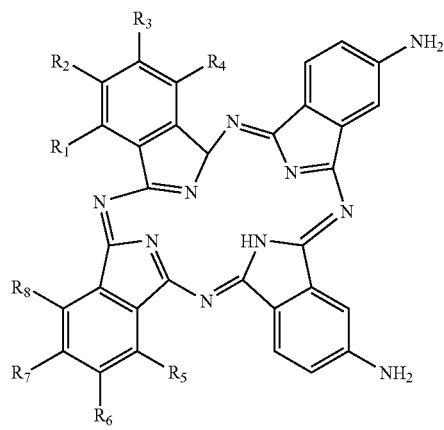

or

9. The manufacturing method of the thin film material according to claim 6, wherein the step S2 comprises:

S24: rotarily evaporating the first mixture to obtain a second crude product, and rotarily evaporating a filtrate obtained by leaching the second crude product by a second eluent to obtain the purified compound C1 or the purified compound C2.

10. The manufacturing method of the thin film material according to claim 1, wherein the step S3 comprises:

S31: providing a third container containing a third solvent dissolving with the compound C; and S32: adding the fluorine-containing dianhydride compound to the third container at a fourth reaction temperature for a third reaction time to form a polymer D1 or a polymer D2.

11. The manufacturing method of the thin film material according to claim 10, wherein a structural formula of the polymer D1 is:

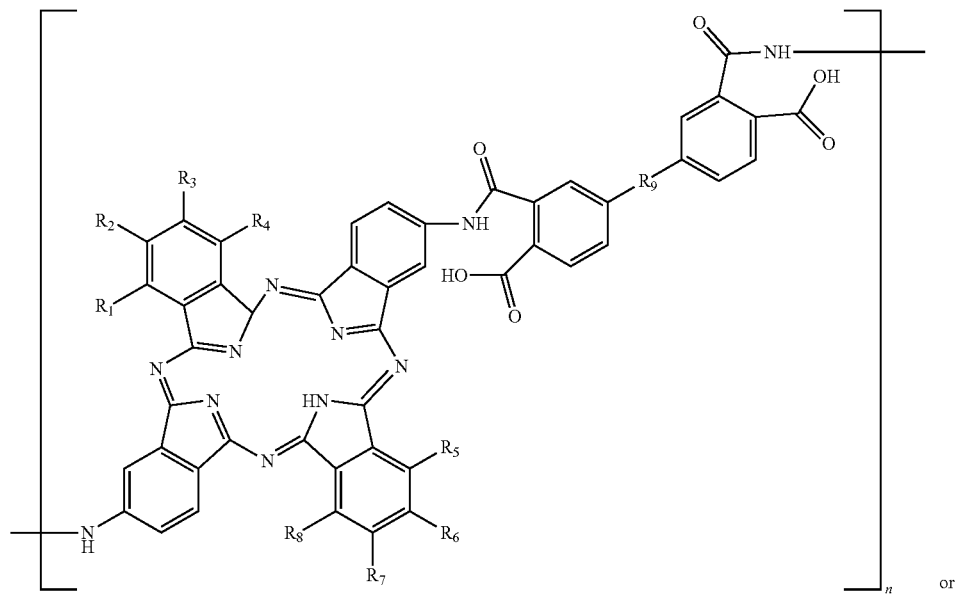

or

-continued
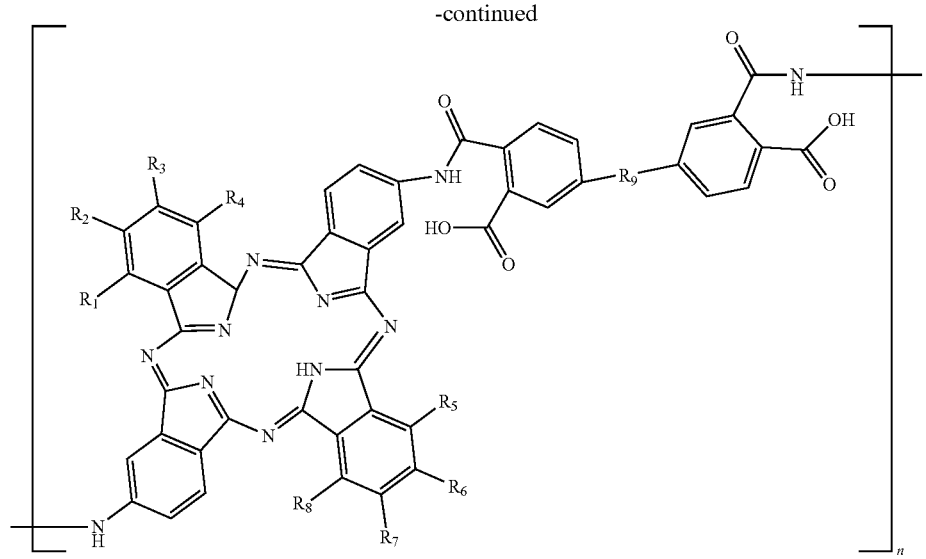
12. The manufacturing method of the thin film material according to claim 10, wherein a structural formula of the polymer D2 is:
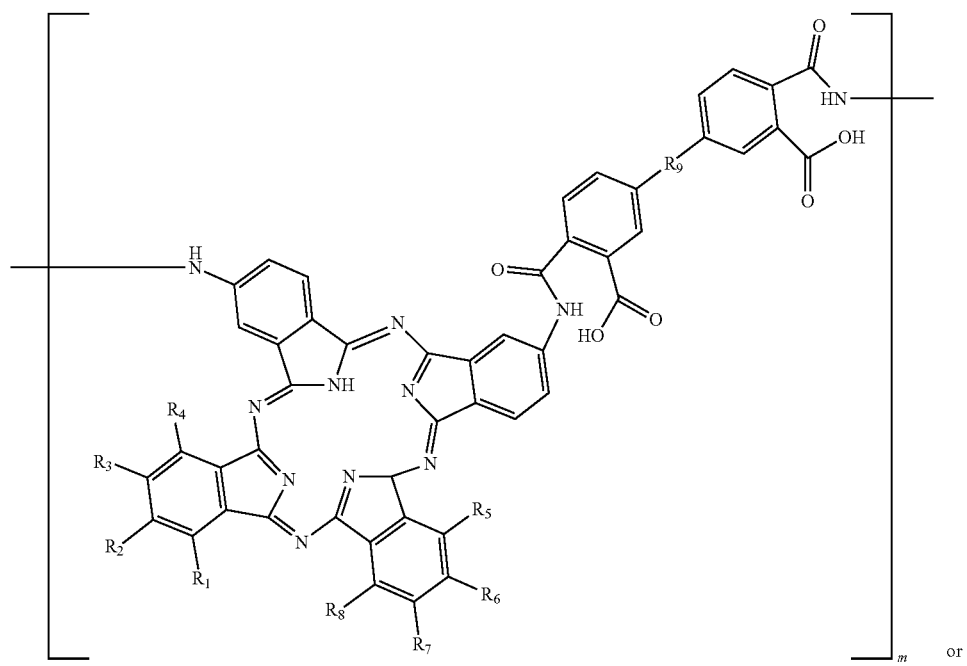
or -continued

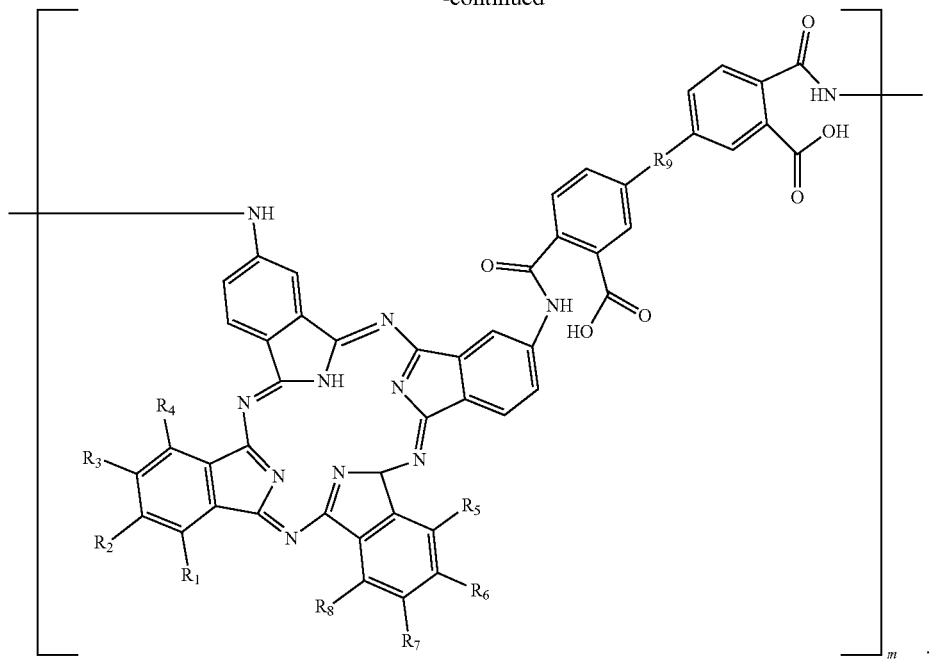

13. The manufacturing method of the thin film material according to claim 1, wherein the step S4 comprises:
    S41: providing a fourth container containing a fourth solvent dissolving with the polymer D;
    S42: terminating a reaction in the fourth container after reacting at a fifth reaction temperature for a fourth reaction time to obtain the second mixture including the polymer F or the polymer H; and
    S43: filtering the second mixture using an organic filtration membrane at a first filter temperature to obtain the solution including the polymer F or the solution including the polymer H.

14. The manufacturing method of the thin film material according to claim 1, wherein the step S5 comprises:
    S51 coating the solution including the polymer F or the solution including the polymer H on the substrate;
    S52: forming the polymer F or the polymer H on the substrate by a first predetermined process; and
    S53: the polymer F or the polymer H forming the thin film material by a second predetermined process.

15. The manufacturing method of the thin film material according to claim 14, wherein the step S52 comprises:
    S52a: transferring the substrate to a first oven to remove a fourth solvent at a first drying temperature for a first drying time; and
    S52b: transferring the substrate to a second oven to form the polymer F or the polymer H on the substrate at a second drying temperature for a second drying time.

* * * * *